United States Patent [19]
Hibino

[11] Patent Number: 6,075,722
[45] Date of Patent: Jun. 13, 2000

[54] SEMICONDUCTOR MULTIVALUED MEMORY DEVICE DETERMINING MULTIVALUED READ-OUT DATUM BY COMPARING IT WITH CORRESPONDING REFERENCE DATA

[75] Inventor: Kenji Hibino, Tokyo, Japan

[73] Assignee: NEC Corporation, Tokyo, Japan

[21] Appl. No.: 09/289,639

[22] Filed: Apr. 12, 1999

[30] Foreign Application Priority Data

Apr. 14, 1998 [JP] Japan .................................. 10-103014

[51] Int. Cl.[7] .................................................. G11C 11/56
[52] U.S. Cl. ........................... 365/168; 365/104; 365/210
[58] Field of Search .................................... 365/168, 210, 365/185.03, 185.22, 104

[56] References Cited

U.S. PATENT DOCUMENTS 5,933,366  8/1999  Yoshikawa ........................ 365/185.03

*Primary Examiner*—Huan Hoang
*Attorney, Agent, or Firm*—McGinn & Gibb, P.C.

[57] ABSTRACT

A semiconductor multivalued read only memory device stores multivalued data in a memory cell array and multivalued reference data in reference cell arrays, and stepwise changes word lines and reference word lines to different active levels for reading out the multivalued data and the corresponding multivalued reference data at different timings so as to determine the value of each multivalued datum by comparing it to the multivalued reference data without undesirable influence of deviated threshold and unintentionally deviated active level.

14 Claims, 19 Drawing Sheets

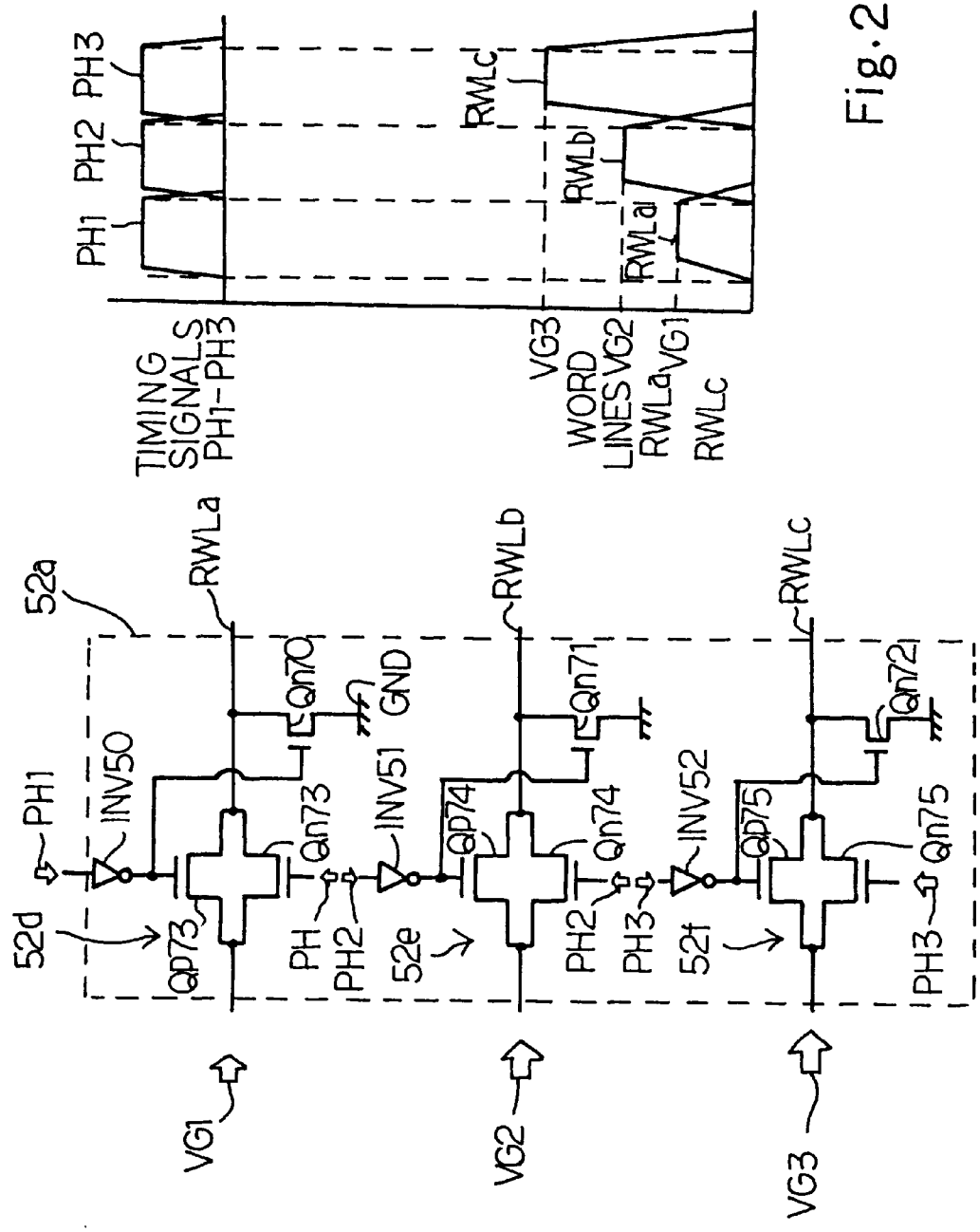

SEMICONDUCTOR MULTIVALUED MEMORY DEVICE DETERMINING MULTIVALUED READ-OUT DATUM BY COMPARING IT WITH CORRESPONDING REFERENCE DATA

FIELD OF THE INVENTION

This invention relates to a semiconductor memory device and, more particularly, to a semiconductor multivalued read only memory device for storing multivalued data.

DESCRIPTION OF THE RELATED ART

The semiconductor multivalued read only memory device has memory cells for storing multivalued data, and the multivalued data are represented by plural thresholds selectively assigned to the memory cells. Word lines are selectively connected to the memory cells, and a potential level on a selected word line is stepwise changed. When the potential level on the selected word line exceeds one of the thresholds of a selected memory cell, electric current flows through the selected memory cell, and the multivalued datum is determined on the basis of the timing.

FIG. 1 illustrates a prior art semiconductor multivalued read only memory device. The prior art semiconductor multivalued read only memory device is broken down into two sections, i.e., a data storage section 1 and a reference voltage generator 2. The data storage section 1 includes plural read-only memory cells 1a. Though not shown in FIG. 1, the plural memory cells 1a are grouped into plural memory banks respectively assigned bank addresses.

The read-only memory cells in each memory bank are arranged in rows and columns. The rows of read-only memory cells are respectively assigned row addresses, and column addresses are respectively assigned to the columns of read-only memory cells. Therefore, read-only memory cells are selected from the memory cell array by using the bank address, the row address and the column address.

Different thresholds Vt0/Vt1/Vt2/Vt3 are selectively given to the read-only memory cells, and the threshold of each read-only memory cell was determined during the fabrication process.

The data storage section 1 further comprises a bank address decoder 1b, a row address decoder 1c, a column address decoder 1d, a bank selector 1e and column selectors 1f/1g. The columns of read-only memory cells are selectively connectable to digit lines DL. The row address decoder 1c is connected to the rows of memory cells through word lines WL, and selectively changes the word lines WL to an active potential range. As described hereinlater, the active level is stepwise changed on the selected word line WL, and the read-only memory cells connected to the selected word line are checked to see what multivalued data are stored therein.

A bank address signal is supplied to the bank address decoder 1b, and the bank address decoder decodes the bank address signal so as to selectively change bank select lines EL to an active level. The memory banks are selectively connected to the bank select lines EL, and selected memory banks are connected to the digit lines DL. A column address signal is supplied to the column address decoder 1d, and the column address decoder 1d causes the column selectors 1f/1g to select the digit lines DL. The column selector 1g connects selected columns of read-only memory cells to a ground line. The data storage section 1 further includes sense amplifiers SAMP00, SAMP01 ... and SAMPxx, differential circuits DF00, DF01, ... and DFxx and converters CONV00, CONV01, ... and CONVxx. The column selector 1f connects the sense amplifiers SAMP00–SAMPxx to the selected digit lines DL, and supply electric currents through the column selector 1f to the selected digit lines DL. If a selected read-only memory cell interrupts the electric current, the associated digit line has a high potential level. On the other hand, if the electric current flows through the selected read-only memory cell, the potential level on the associated digit line falls to a low potential level. The sense amplifiers SAMP00–SAMPxx produce sense signals SA00/SA01/.../SAxx respectively representative of the potential levels on the selected digit lines DL, and supply the sense signals SA00–SAxx to the associated differential circuits DF00–DFxx, respectively. A reference signal RSA is supplied from the reference voltage generator 2 to the differential circuits DF00–DFxx, and the differential circuits DF00–DFxx compare the magnitude of the sense signals SA00–SAxx with the magnitude of a reference signal RSA. The differential circuits DF00–DFxx produce read-out signals SO00–SOxx representative of the multivalued read-out data, and the read-out signals SO00–SOxx are supplied from the differential circuits DF00–DFxx to the converters CONV00–CONVxx, respectively. Each of the converters CONV00–CONVxx converts the associated read-out signal SO00–SOxx to a two-bit output data signal DS00/DS01/.../DSxx.

The data storage section 1 further comprises a constant voltage generator 1h and a voltage selector 1j. The constant voltage generator 1h generates three constant voltages VG1/VG2/VG3, and supplies the constant voltages VG1/VG2/VG3 to the voltage selector 1j. The voltage selector 1j is responsive to timing signals PH1/PH2/PH3 so as to selectively transfer the constant voltages VG1/VG2/VG3 to the row address decoder 1c. For this reason, the row address decoder 1c stepwise changes the potential level on the selected word line WL between the constant voltages VG1, VG2 and VG3.

The reference voltage generator 2 comprises a single reference amplifier 2a, a reference cell array 2b, reference selectors 2c/2d, a reference row address decoder 2e and a reference bank selector 2f. The reference cell array 2b includes reference memory cells RMC arranged in rows, and the reference memory cells RMC are connectable through the reference bank selector 2f to reference digit lines RDL. The reference selector 2c is connected between the reference amplifier 2a and the reference digit lines RDL, and the other reference selector 2d is connected between the reference digit lines RDL and the ground line.

The reference row address decoder 2e is connected through reference word lines RWL to reference memory cells RMC as shown in FIG. 2, and the threshold Vt0 is given to the reference memory cells RMC. The constant voltage VG1 is supplied from the constant voltage generator 1h to the reference row address decoder 2e, and the reference row address decoder 2e applies the constant voltage VG1 to the reference word line RWL. The reference amplifier 2a supplies electric current through the reference selector 2c, the reference digit lines RDL and the reference bank selector 2f to the reference memory cells RMC, and the potential level on the reference digit lines is supplied to the differential circuits DF00–DFxx as the reference signal RSA.

Multivalued data are read out from the memory cell array 1a as follows. The constant voltages VG1/VG2/VG3 and the thresholds Vt0/Vt1/Vt2/Vt3 are adjusted as follows.

$$Vt0 < VG1 < Vt1 < VG2 < Vt2 < VG3 < Vt3$$

Potential differences dV0 between the constant voltages VG1/VG2/VG3 and the thresholds Vt0/Vt1/Vt2/Vt3 are designed to be constant as follows.

dV0=VG1-Vt0=VG2-Vt1=VG3-Vt2

The reference memory cells RMC and the reference word line RWL also satisfy the above relation, i.e., dV0=VG1-Vt0.

First, a selected memory cell is assumed to have the threshold Vt0. The row address decoder 1c stepwise changes the potential level on the associated word line WL. When the word line WL is changed to VG0, the selected memory cell turns on, and the electric current flows through the selected memory cell. The amount of electric current is corresponding to the potential difference dV0. The potential level on the associated digit line falls to a low level Vsa0, and the sense amplifier SAMP00/ . . . /SAMPxx supplies the sense signal SA00/ . . . /SAxx to the differential circuit DF00/ . . . /DFxx. As described hereinbefore, the reference memory cells RMC are adjusted to the threshold Vt0, and the reference amplifier 2a supplies a reference signal RSA representative of the potential level Vsa0. The sense signal SA00/ . . . /SAxx is equal in magnitude to the reference signal RSA, and the differential circuit DF00/ . . . /DFxx changes the read-out signal SO00/ . . . /SOxx to a high level H.

Subsequently, the selected memory cell is assumed to have the threshold Vt1. When the row address decoder 1c changes the word line WL to the constant voltage VG1, the selected memory cell is maintained in the off-state, and the associated sense amplifier supplies the sense signal SA00/ . . . /SAxx at a high level Vsa3 to the differential circuit DF00/ . . . /DFxx. The high level Vsa3 is higher than the low level Vsa0. The sense signal SA00/ . . . /SAxx is higher than the reference signal RSA, and the differential circuit DF00/ . . . /DFxx keeps the read-out signal SO00/ . . . /SOxx at the low level.

The row address decoder 1c increases the selected word line WL from the constant voltage VG1 to the next constant voltage level VG2. Then, the selected memory cell turns on. The electric current flows through the selected memory cell, and the potential level on the associated digit line DL falls to the low level Vsa0. The differential circuit DF00/ . . . /DFxx admits that the associated digit line DL is equal in potential level to the reference digit line RDL, and changes the read-out signal SO00/ . . . /SOxx to the high level H.

If the selected memory cell has the threshold Vt2, the associated differential circuit DF00/ . . . /DFxx changes the read-out signal SO00/ . . . /SOxx from the low level to the high level at the change from the constant voltage VG2 to the constant voltage VG3. However, the constant voltage VG3 on the word line WL can not change a selected memory cell with the threshold Vt3 to the on-state, and the selected memory cell are staying in the off-state at all times. Thus, the converter CONV00–CONVxx determines the value of the read-out data on the basis of the timing at which the read-out signal SO00/ . . . /SOxx is changed from the low level L to the high level H.

The prior art semiconductor multivalued read only memory device stores multivalued data in the memory cell array 1a in the form of threshold, and determines the value of each datum on the assumption that a predetermined amount of electric current starts to flow through the selected memory cell at the change of potential level over the threshold thereof. However, the assumption is not always valid. If process parameters fluctuate, the fluctuation may move the threshold from the target values Vt0/Vt1/Vt2/Vt3. The constant voltage generator 1h may generate the constant voltages VG1/VG2/VG3 deviated from the designed values. In this situation, the relation between the constant voltages VG1/VG2/VG3 and the thresholds Vt0/Vt1/Vt2/Vt3 is not satisfied, and the converters CONV00–CONVxx fails to correctly assign a value to the read-out datum.

FIG. 3 illustrates the data read-out from the first memory cell having the designed threshold Vt0, the second memory cell having the threshold undesirably shifted from the designed value Vt1 to a larger value Vt1u due to fluctuation of process parameters, the third memory cell having the designed threshold Vt2 and the fourth memory cell having the designed threshold Vt3. The constant voltages VG1/VG2 are adjusted to the designed values. However, the constant voltage VG3d is lower than the designed constant voltage VG3 due to a trouble in the constant voltage generator 1h.

The data are correctly read out from the first and fourth memory cells, and the description is omitted. The second memory cell has the threshold Vt1u higher than the designed threshold Vt1. The second memory cell is turned off under the constant voltage VG1 on the word line WL. When the word line WL is changed to the constant voltage VG2, the second memory cell turns on. However, the potential difference between the word line WL and the threshold Vt1u is smaller than that between the word line WL and the threshold Vt1. As a result, the electric current is not so much as usual, and the digit line DL merely falls to a potential level Vsa1 between the potential levels Vsa0 and Vsa3. On the other hand, the reference voltage generator 2 fixes the reference signal RSA to the potential level Vsa0, and the differential circuit DF00/DF01/ . . . /DFxx determines that the potential level on the digit line does not reach the high level H. When the word line WL is changed to the constant voltage VG3, the differential circuit DF00/ . . . /DFxx admits that the potential level on the digit line is low enough to change the sense signal SO00/ . . . /SOxx. Thus, the change to the high level H is delayed.

The third memory cell keeps the potential level on the digit line DL at the high level before the change to the constant voltage VG3d, and, accordingly, the differential circuit DF00/DF01/ . . . /DFxx keeps the read-out signal SO00/ . . . /SOxx at the low level L. When the word line is changed to the constant voltage VG3d, the word line WL exceeds the threshold Vt2, and the third memory cell turns on. However, the potential difference between the constant voltage VG3d and the threshold Vt2 is smaller than usual, and the amount of current is less than usual. For this reason, the digit line DL falls to an intermediate potential level Vsa2, and the associated differential circuit DF00/ . . . . /DFxx regulates the read-out signal SO00/ . . . . /SOxx to an intermediate level M lower than the high level H.

As will be understood, the defective memory cells and the defective constant voltage generator 1h decrease the margin between the read-out signals SO00/ . . . . SOxx and the high/low levels in the converters CONV00/ . . . /CONVxx, and the converters CONV00/ . . . . . /CONVxx are liable to misjudge the read-out data. Thus, the problem inherent in the prior art semiconductor multivalued read only memory device is the low reliable data read-out.

SUMMARY OF THE INVENTION

It is therefore an important object of the present invention to provide a semiconductor multivalued memory device, which delivers reliable read-out data to an external device.

To accomplish the object, the present invention proposes to equally affect both of the memory cell array and the reference cell array.

In accordance with one aspect of the present invention, there is provided a semiconductor multivalued memory device comprising a memory cell array including plural memory cells for storing pieces of data information selectively representing more than two values, an addressing circuit having selecting lines selectively connected to the plural memory cells and driving at least one of the selecting lines so as to read out the pieces of data information at different timings corresponding to the more than two values, a reference signal generator including plural reference cells for storing pieces of reference data information respectively representing at least two of the more than two values and reference selecting lines respectively connected to the plural reference cells and selectively driven for reading out the pieces of reference data information at timings selected from the different timings and corresponding to the at least two of the more than two values, and a data discriminator connected to the memory cell array and the reference signal generator and determining the value of each piece of data information read out from the memory cell array on the basis of the pieces of reference data information so as to produce an output data signal.

BRIEF DESCRIPTION OF THE DRAWINGS

The features and advantages of the semiconductor multivalued memory device will be more clearly understood from the following description taken in conjunction with the accompanying drawings in which:

FIG. 20 is a circuit diagram showing the circuit configuration of a reference row selector incorporated in the semiconductor multivalued read only memory device; and FIG. 21 is a graph showing the potential level on a reference word line.

DESCRIPTION OF THE PREFERRED EMBODIMENTS

First Embodiment

Figure 1:
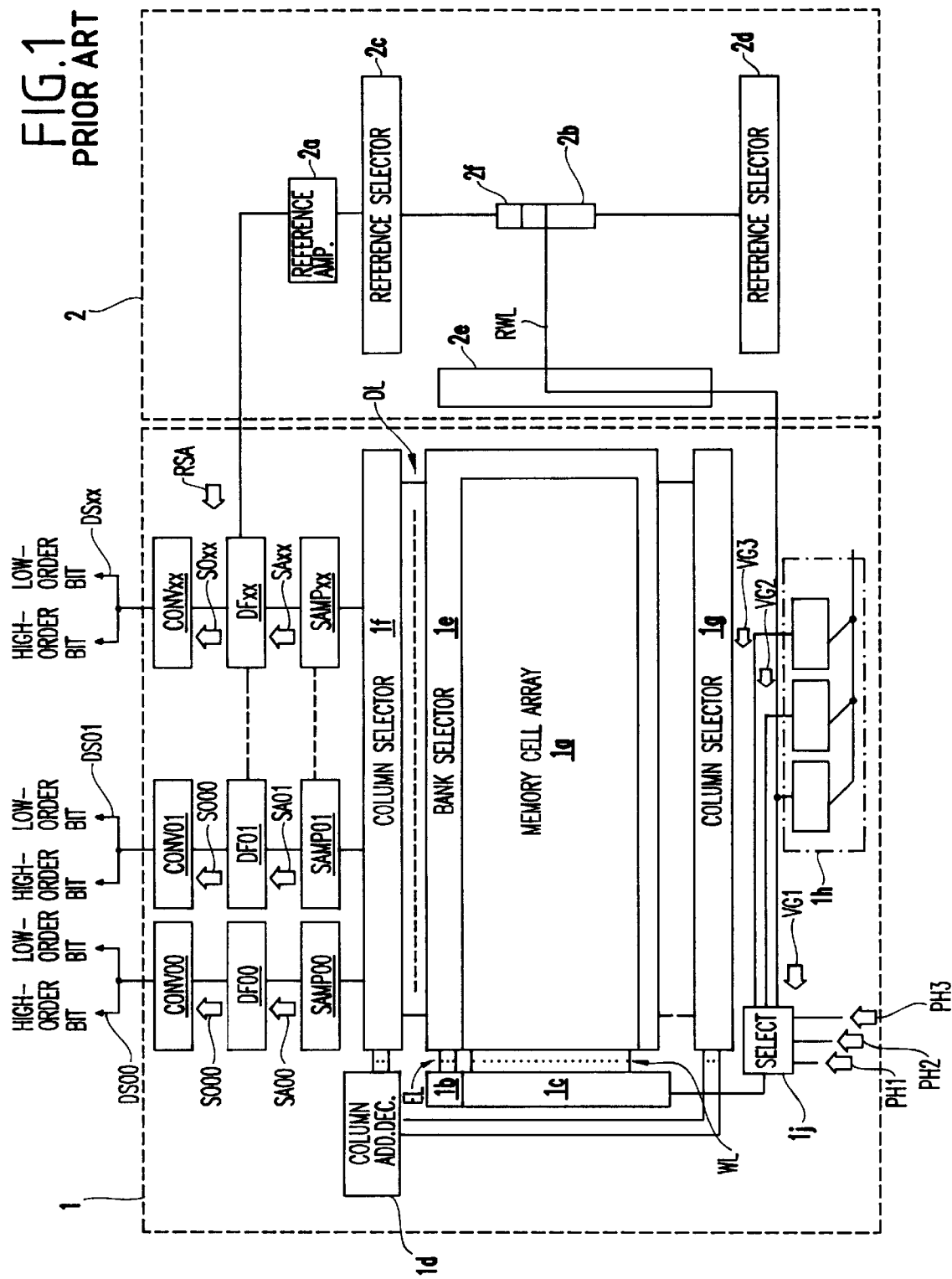
FIG. 1 is a block diagram showing the arrangement of the prior art semiconductor multivalued read only memory device.
Figure 2:
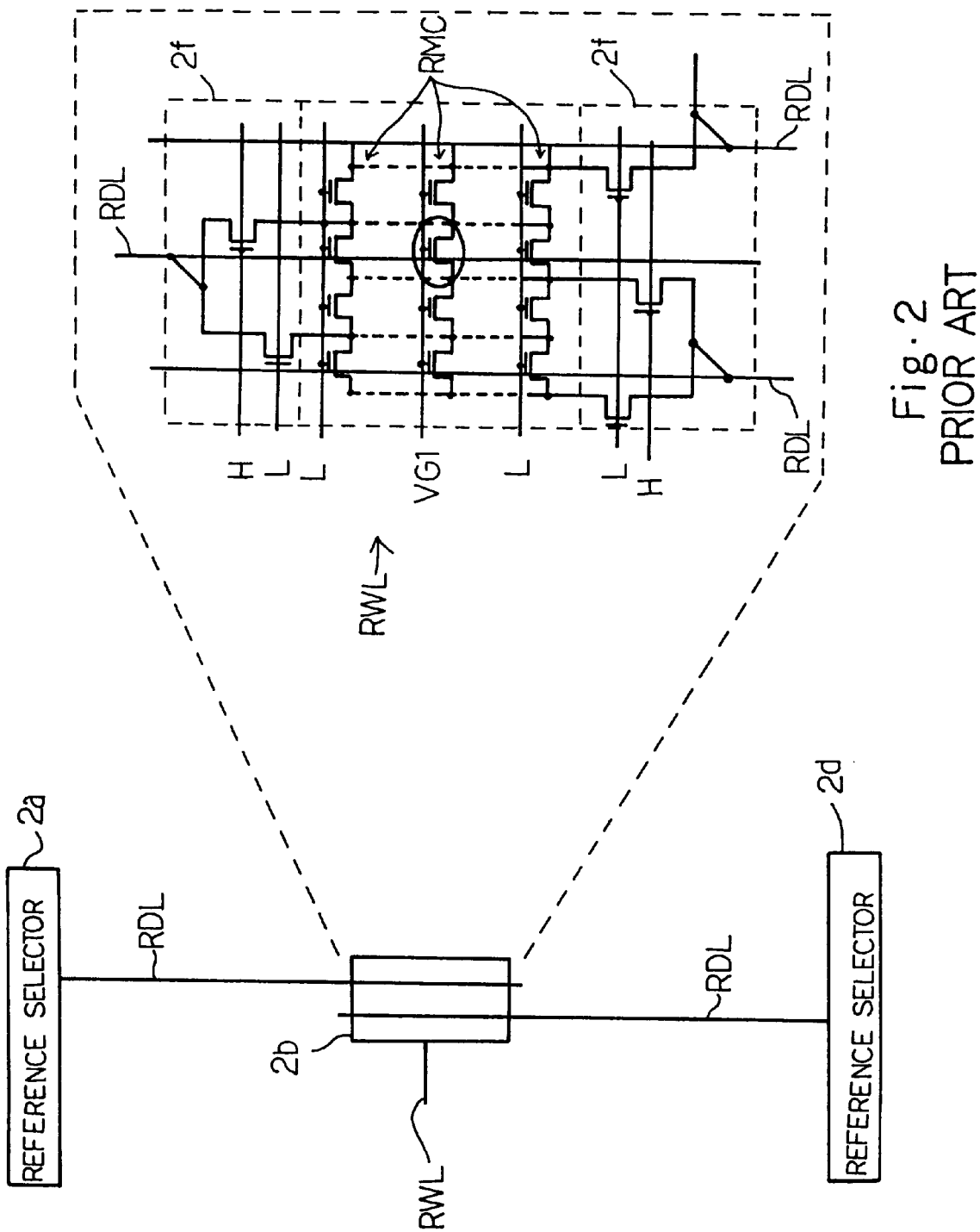
FIG. 2 is a circuit diagram showing the circuit configuration of the reference memory cell array incorporated in the prior art semiconductor multivalued read only memory device.
Figure 3:
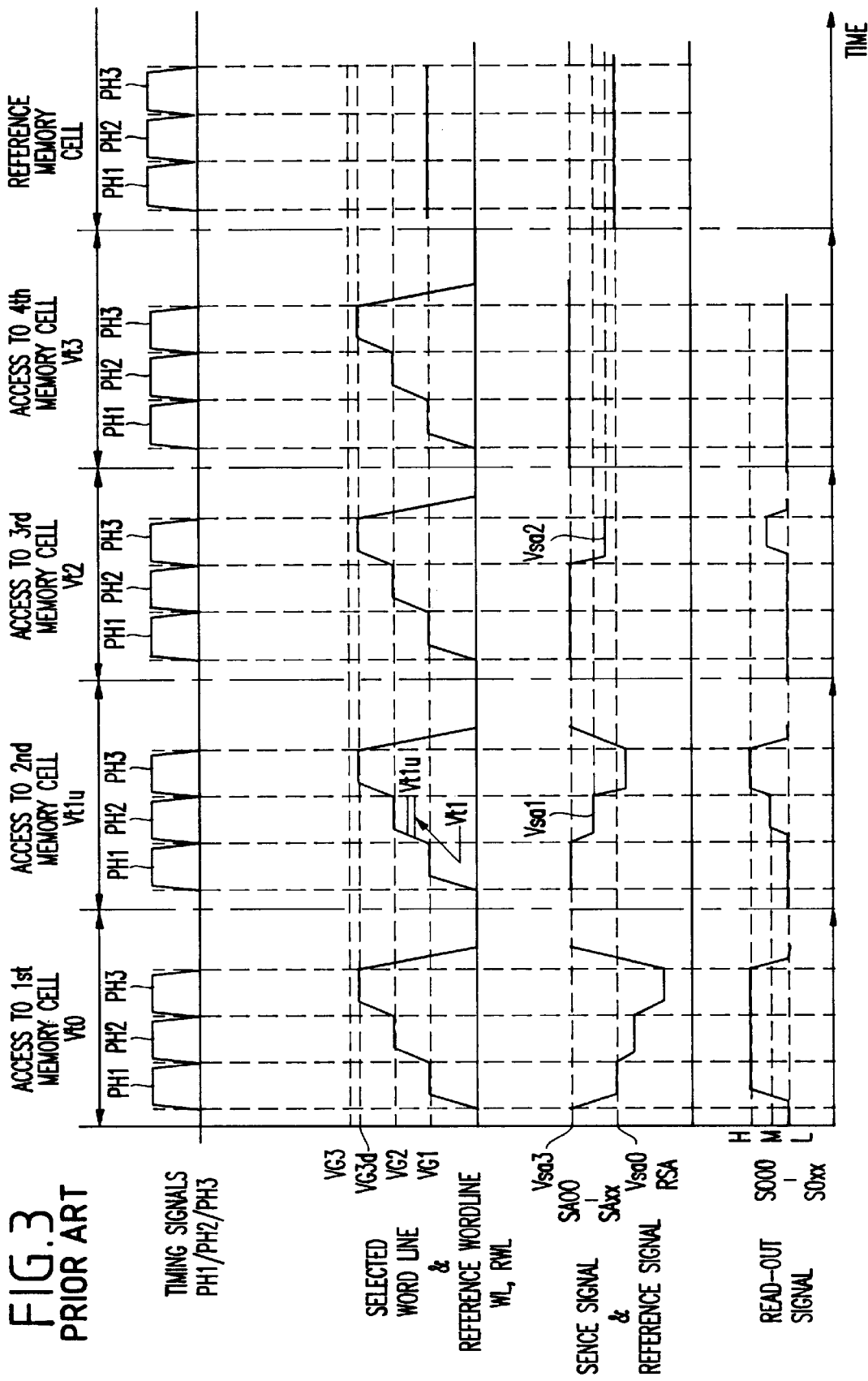
FIG. 3 is a graph showing the potential waveforms observed in the prior art defective multivalued read only memory device.
Figure 4:
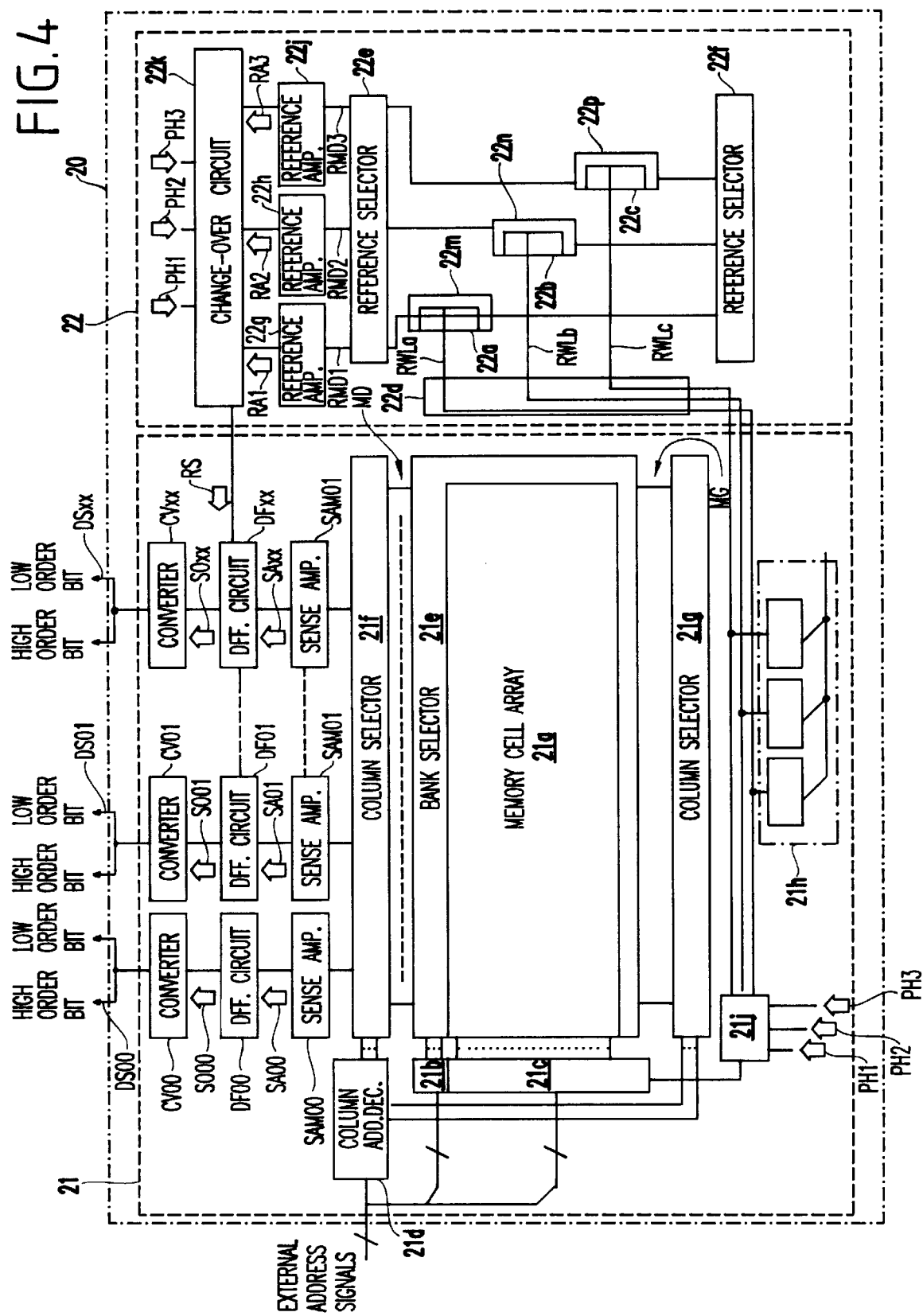
FIG. 4 is a circuit diagram showing the circuit configuration of a semiconductor multivalued read only memory device according to the present invention.

Referring to FIG. 4 of the drawings, a semiconductor multivalued read only memory device is fabricated on a semiconductor chip 20. The semiconductor multivalued read only memory device is broken down into a data storage section 21 and a reference voltage generator 22. The semiconductor multivalued read only memory device is categorized into a mask ROM (Read Only Memory), and multivalued data are stored during the fabrication process. The reference voltage generator 22 produces a reference signal RS under the same conditions in the data storage section 21, and supplies the reference signal RS to the data storage section 21. The data are also read out through the stepwise potential change, and read-out signals SO00/SO01/ . . . /SOxx are compared with the reference signal RS for producing two-bit output data signals DS00/DS01/ . . . /DSxx. The two-bit output data signals DS00–DSxx are supplied to an external device (not shown).

The data storage section 21 includes a memory cell array 21a. Plural read-only memory cells form the memory cell array 21a. Though not shown in FIG. 4, the memory cell array 21a is divided into plural memory banks respectively assigned bank addresses. The read-only memory cells in each memory bank are arranged in rows and columns. The rows of read-only memory cells are respectively assigned row addresses, and column addresses are respectively assigned to the columns of read-only memory cells. Therefore, read-only memory cells are selected from the memory cell array 21a by using the bank address, the row address and the column address.

The read-only memory cells are implemented by field effect transistors, and different thresholds Vt0/Vt1/Vt2/Vt3 are selectively given to the field effect transistors, and the threshold of each read-only memory cell was determined during the fabrication process.

The data storage section 21 further comprises a bank address decoder 21b, bank select lines BL, a row address decoder 21c, word lines WL, a column address decoder 21d, a bank selector 21e, column selectors 21f/21g, main/subvirtual ground lines MG/SG and main/sub-digit lines MD/SD. A bank address signal, a row address signal and a column address signals are supplied to the bank address decoder 21b, the row address decoder 21c and the column address decoder 21d, respectively, and the bank address decoder 21b, the row address decoder 21c and the column address decoder 21d control the bank selector 21e, the word lines WL and the column selectors 21f/21g, respectively.

Figure 5:
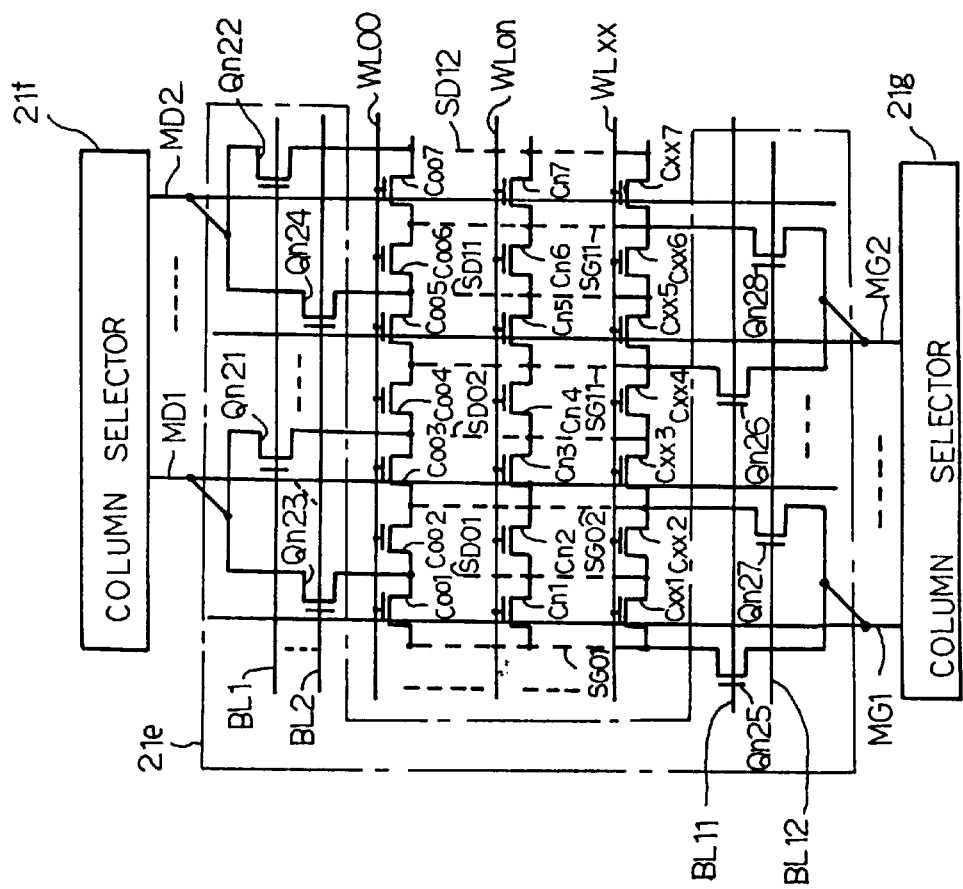
FIG. 5 is a circuit diagram showing the circuit configuration of a data storage section incorporated in the semiconductor multivalued read only memory device.

Arrangement between these circuit components and the read-only memory cells are shown in FIG. 5. The word lines WL00, . . . , WL0n, . . . and WLxx are connected to the rows of read-only memory cells C001, . . . C007 . . . ; Cn1, . . . Cn7 . . . ; . . . ; Cxx1, . . . Cxx7. The word lines WL00–WLxx are connected to the row address decoder 21c, and are selectively driven to an active potential range.

The virtual sub-ground lines SG01–SG12 and the sub-digit lines SD01–SD12 are implemented by elongated impurity regions formed in the semiconductor chip 20. The virtual sub-ground lines SG01/SG02/SG11/SG12 are alternated with the sub-digit lines SD01/SD02/SD11/SD12, and the virtual sub-ground lines SG01–SG12 and the sub-digit lines SD01–SD12 are connected to source/drain nodes of the rows of read-only memory cells C001–C007, Cn1–Cn7 , . . . , Cxx1–Cxx7. Therefore, each sub-digit line SD1–SD12 is connectable through a read-only memory cell to associated one of the virtual sub-ground lines SG01–SG12.

Figure 6:
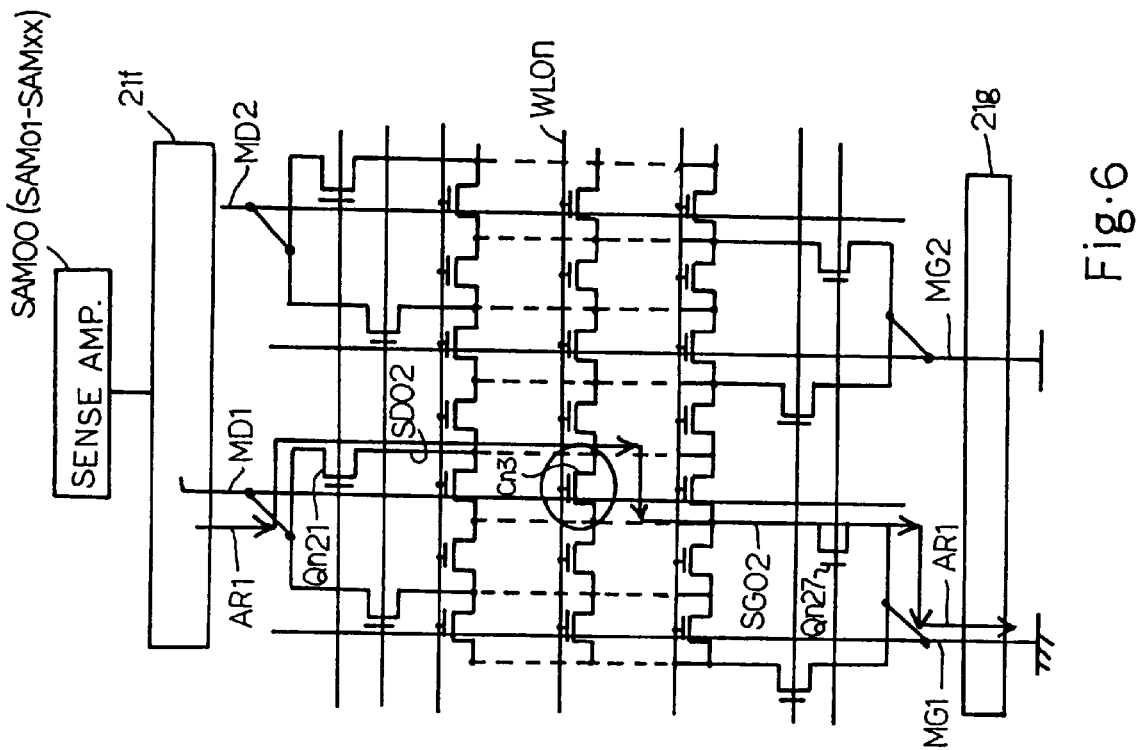
FIG. 6 is a circuit diagram showing a current path through the data storage section.

The bank selector 21e is implemented by two arrays of n-channel enhancement type switching transistors Qn21/Qn22/Qn23/Qn24 and Qn25/Qn26/Qn27/Qn28. The first array of n-channel enhancement type switching transistors Qn21–Qn24 is connected between the sub-digit lines SD01/SD02/SD11/SD12 and the main digit lines MD1/MD2, and the bank select lines BL1/BL2 are connected to the gate electrodes of the n-channel enhancement type switching transistors Qn21/Qn22 and the gate electrodes of the n-channel enhancement type switching transistors Qn23/Qn24. The bank address decoder 21b selectively changes the bank select lines BL1/BL2 to an active high level, and the main digit lines MD1–MS2 are selectively connected to the sub-digit lines SD01–SD02 and SD11–SD12. The second array of n-channel enhancement type switching transistors Qn25/Qn26/Qn27/Qn28 is connected between the virtual sub-ground lines SG01–SG12 and the main virtual ground lines MG1/MG2. The bank select lines BL11/BL12 are respectively connected to the gate electrodes of the n-channel enhancement type switching transistors Qn25/Qn26 and the gate electrode of the n-channel enhancement type switching transistors Qn27/Qn28, and the bank address decoder 21b selectively changes the bank selecting lines BL11/BL12 to the active high level, and the virtual sub-ground lines SG01/SG02 and SG11/SG12 are selectively connected to the main virtual ground lines MG1/MG2. Thus, the bank address decoder 21b controls the bank selector 21e so as to make the main digit lines MD1/MD2 connectable through the read-only memory cells of a selected row to the main virtual ground lines MG1/MG2, respectively. The bank address signal, the row address signal and the column address signals are assumed to select the read-only memory cell Cn3 from the memory cell array 21a. If the word line WL0n rises over the threshold of the selected read-only memory cell Cn3, the electric current flows through the column selector 21f, the main digit line MD1, the n-channel enhancement type switching transistor Qn21, the sub-digit line SD02 into the selected read-only memory cell Cn3, and passes through the selected read-only memory cell Cn3. The electric current further flows through the virtual sub-ground line SG02, the n-channel enhancement type switching transistor Qn27 , the main ground line MG1 and the column selector 21g into the ground line. The current path is indicated by arrow AR1 in FIG. 6. Turning back to FIG. 4, the data storage section 21 further includes sense amplifiers SAM00, SAM01 . . . and SAMxx, differential circuits DF00, DF01, . . . and DFxx and converters CV00, CV01, . . . and CVxx. The column selector 21f selectively connects the sense amplifiers SAM00–SAMxx to the selected main digit lines MD, and supply electric currents through the column selector 21f to the selected main digit lines MD. If a selected read-only memory cell interrupts the electric current, the associated main digit line MD has a high potential level, and the associated sense amplifier SAM00–SAMxx detect the potential level thereon. On the other hand, if the electric current flows through the selected read-only memory cell to the main virtual ground line MG, the potential level on the associated digit line falls to a low potential level, and the potential fall is also detected by the associated sense amplifier SAM00–SAMxx.

The sense amplifiers SAM00–SAMxx produce sense signals SA00/SA01/ . . . /SAxx respectively representative of the potential levels on the selected main digit lines MD, and supply the sense signals SA00–SAxx to the associated differential circuits DF00–DFxx, respectively. The reference signal RS is supplied from the reference voltage generator 22 to the differential circuits DF00–DFxx, and the differential circuits DF00–DFxx compare the magnitude of the sense signals SA00–SAxx with the magnitude of a reference signal RS. As described hereinbefore, when the thresholds Vt0/Vt1/Vt2/Vt3 and fluctuate, the reference voltage generator 22 changes the potential level of the reference signal RS as will be described hereinlater in detail. The differential circuits DF00–DFxx produce read-out signals SO00–SOxx representative of the multivalued read-out data, and the read-out signals SO00–SOxx are supplied from the differential circuits DF00–DFxx to the converters CV00–CVxx, respectively. Each of the converters CV00–CVxx converts the associated read-out signal SO00–SOxx to a two-bit output data signal DS00/DS01/ . . . /DSxx, and the two-bit output data signals DS00–DSxx are delivered to the external circuit (not shown).

Figure 7:
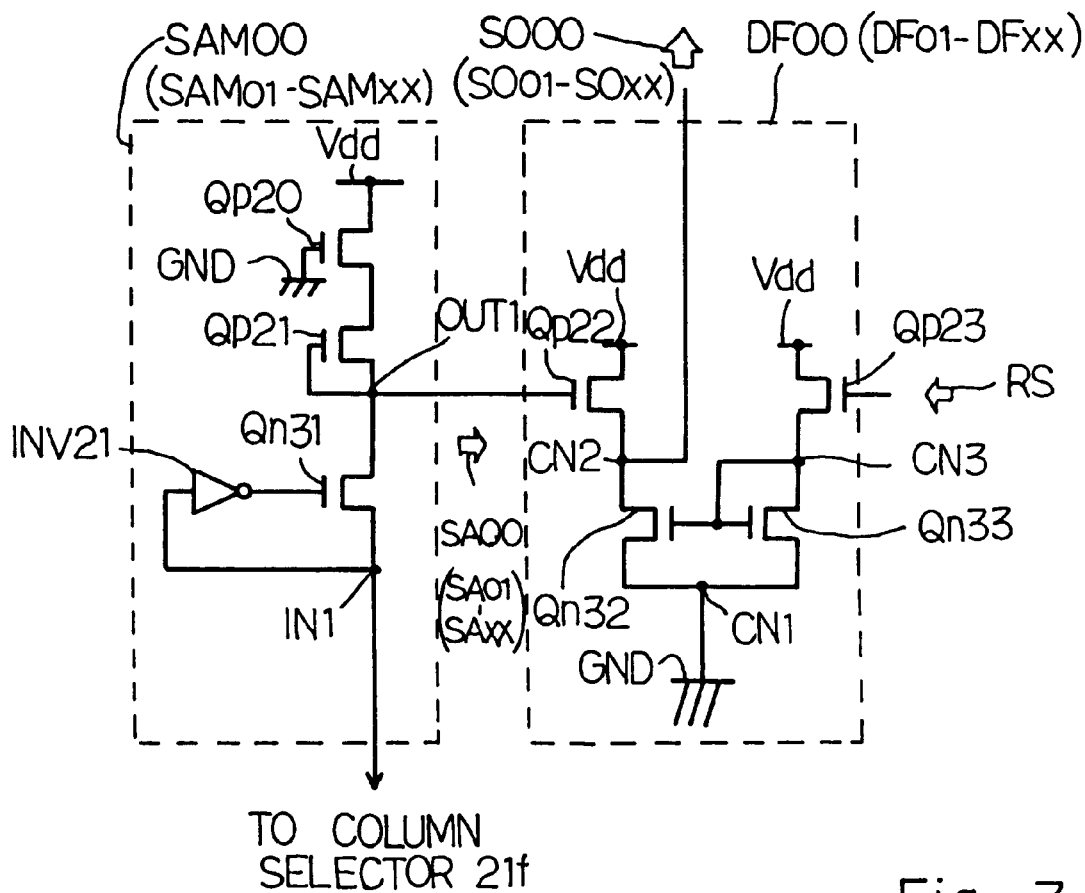
FIG. 7 is a circuit diagram showing the circuit configuration of a sense amplifier and the circuit configuration of a differential circuit both incorporated in the data storage section.

Turning to FIG. 7 of the drawings, one of the sense amplifiers SAM00–SAMxx and the associated differential circuit DF00–DFxx are illustrated in detail. The sense amplifier SAM00–SAMxx includes p-channel enhancement type field effect transistors Qp20/Qp21 and an n-channel enhancement type field effect transistor Qn31 connected in series between a positive power voltage line Vdd and an input node IN1 and an inverter INV21 connected between the input node IN1 and the gate electrode of the n-channel enhancement type field effect transistor Qn31. The p-channel enhancement type field effect transistor Qp20 has a gate electrode connected to the ground line GND, and provides constant resistance against the electric current flowing from the positive power voltage line Vdd into the next p-channel enhancement type field effect transistor Qp21. The p-channel enhancement type field effect transistor Qp21 has a gate electrode connected to an output node OUT1, and changes the channel resistance depending upon the potential level at the output node OUT1.

The input node IN1 is connectable through the column selector 21f, one of the main digit lines MD, the bank selector 21e and one of the sub-digit lines SD to a selected read-only memory cell. If the selected memory cell turns off, the sub-digit line and, accordingly, the input node IN1 start to rise toward the high level equal to the positive power voltage, and exceed the threshold of the inverter INV21.

Then, the inverter INV21 changes the output node to the low level, and supplies the low level to the gate electrode of the n-channel enhancement type field effect transistor Qn31. The n-channel enhancement type field effect transistor Qn31 turns off, and the output node OUT1 is changed to the high level. The potential level at the output node OUT1 serves as the sense signal SA00–SAxx.

On the contrary, when the selected read-only memory cell turns on, the electric current flows through the selected read-only memory cell into the virtual sub-ground line SG, and the main digit line MD and the input node IN1 start to fall toward the low level. The potential level at the input node IN1 becomes lower than the threshold of the inverter INV21, and the inverter INV21 changes the output node to the high level. Then, the n-channel enhancement type field effect transistor Qn31 turns on, and the output node OUT1 is decayed to toward a certain low level. Thus, the sense amplifier SAM00–SAMxx changes the sense signal SA00–SAxx.

The differential circuit DF00–DFxx comprises p-channel enhancement type field effect transistors Qp22/Qp23 connected in parallel to the positive power supply line Vdd and n-channel enhancement type field effect transistors Qn32/Qn33 connected between the drain nodes of the p-channel enhancement type field effect transistors Qp22/Qp23 and a common node CN1. The common node Cn1 is grounded. The sense signal SA00–SAxx and the reference signal RS are supplied to the gate electrodes of the p-channel enhancement type field effect transistors Qp22/Qp23, respectively. The read-out signal SO00–SOxx is supplied from the common drain node CN2 between the p-channel enhancement type field effect transistor Qp22 and the n-channel enhancement type field effect transistor Qn32, and the other common drain node CN3 is connected to the gate electrodes of the n-channel enhancement type field effect transistors Qn32/Qn33. The p-channel enhancement type field effect transistor Qp22 is equal in current driving capability to the other p-channel enhancement type field effect transistor Qp23. The n-channel enhancement type field effect transistor Qn33 is twice to trice larger in current driving capability than the other n-channel enhancement type field effect transistor Qn32.

If the sense signal SA00–SAxx is lower than the reference signal RS, the p-channel enhancement type field effect transistor Qp22 allows a large amount of current to flow, and the read-out signal SO00–SOxx rises to the high level. On the other hand, when the sense signal SA00–SAxx is higher than the reference signal RS, the p-channel enhancement type field effect transistor Qp22 restricts the electric current, and a small amount of current flows into the common drain node CN2. As a result, the read-out signal SO00–SOxx falls to the low level.

Turning back to FIG. 4, the data storage section 21 further comprises a constant voltage generator 21$h$ and a voltage selector 21$j$. The constant voltage generator 21$h$ generates three constant voltages VG1/VG2/VG3 different from one another, and supplies the constant voltages VG1/VG2/VG3 to the voltage selector 21$j$. The voltage selector 21$j$ is responsive to timing signals PH1/PH2/PH3 so as to selectively transfer the constant voltages VG1/VG2/VG3 to the row address decoder 21$c$. The row address decoder 21$c$ drives the selected word line WL to the given constant voltage VG1/VG2/VG3. For this reason, the row address decoder 21$c$ stepwise changes the potential level on the selected word line WL between the constant voltages VG1, VG2 and VG3. The constant voltages VG1/VG2/VG3 and the thresholds Vt0/Vt1/Vt2/Vt3 are regulated as Vt0<VG1<Vt1<VG2<Vt2<VG3<Vt3. In this instance, the constant voltages VG1/VG2/VG3 are supplied to the row address decoder 21$c$ at the timing signal PH1, the timing signal PH2 and the timing signal PH3, respectively.

The reference voltage generator 22 comprises reference cell arrays 22$a$/22$b$/22$c$, reference row selector 22$d$ connected to the constant voltage generator 21$h$, reference selectors 22$e$/22$f$, reference amplifiers 22$g$/22$h$/22$j$, a change-over circuit 22$k$ and reference bank selectors 22$m$/22$n$/22$p$ connected between the reference cell arrays 22$a$–22$c$ and the reference selectors 22$e$/22$f$. The reference row selector 22$d$ stepwise changes the potential level on reference word lines RWLa/RWLb/RWLc between the constant voltages VG1, VG2 and VG3. The reference selector 22$e$ connects the reference memory cell arrays 22$a$/22$b$/22$c$ to the ground line, and the reference selector 22$e$ connects the reference memory cell arrays 22$a$/22$b$/22$c$ to the reference amplifiers 22$g$/22$h$/22$j$, respectively. The change-over circuit 22$k$ is responsive to the timing signals PH1/PH2/PH3 so as to sequentially connect the reference amplifiers 22$g$/22$h$/22$j$ to the differential circuits DF00–DFxx. The reference selectors 22$e$/22$f$ are similar in circuit configuration to the column selectors 21$f$/21$g$, respectively.

Figure 8:
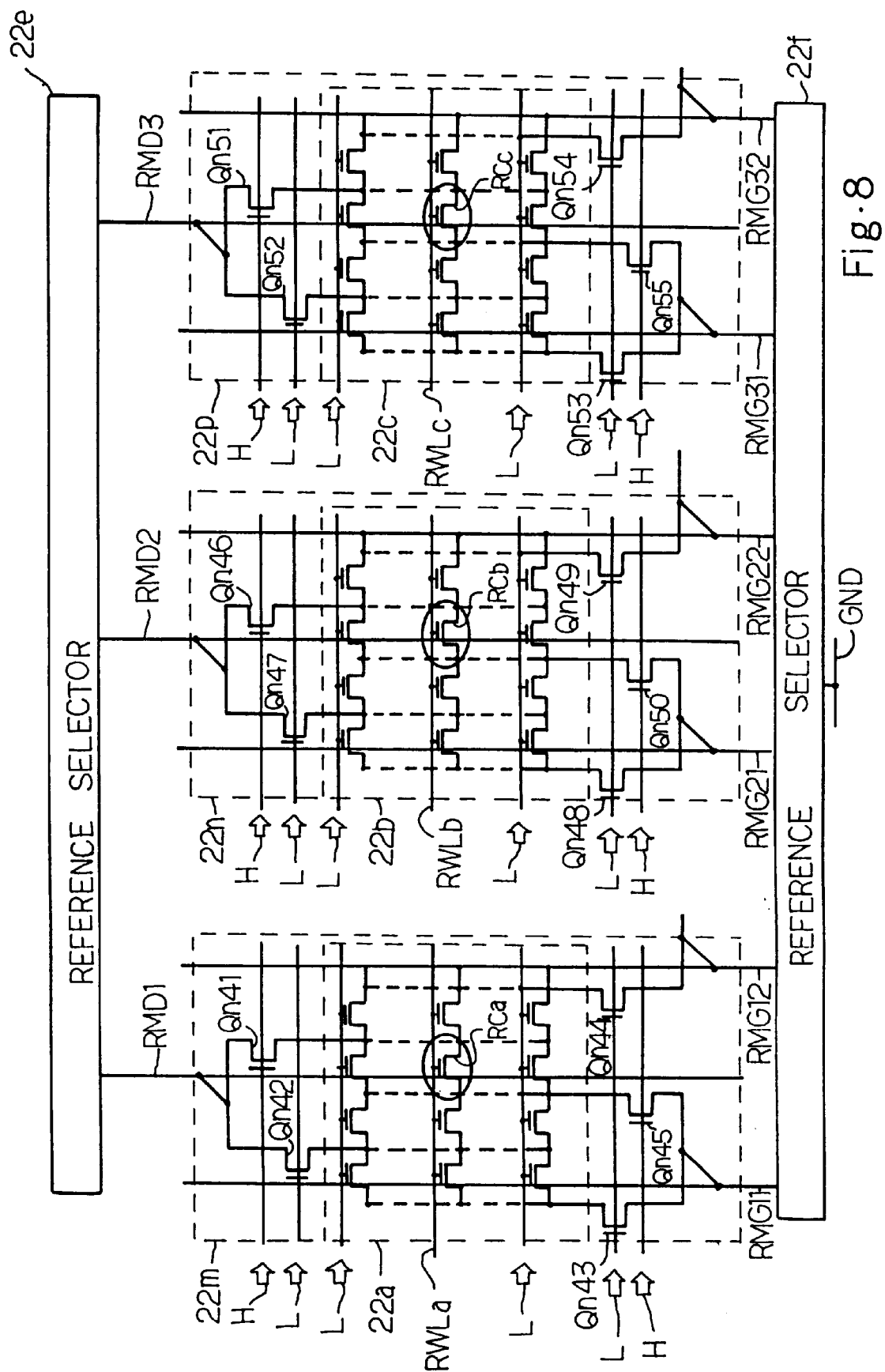
FIG. 8 is a circuit diagram showing the circuit configuration of reference cell arrays incorporated in the semiconductor multivalued read only memory device.

The reference memory cell arrays 22$a$/22$b$/22$c$ are illustrated in FIG. 8. The reference cell arrays 22$a$/22$b$/22$c$ are similar in arrangement to the memory cell array 21$a$ except for the number of cells in each row. The reference cell array 22$a$ has reference cells RCa adjusted to the threshold Vt0. On the other hand, the reference cell arrays 22$b$/22$c$ have reference cells RCb adjusted to the threshold Vt1 and reference cells RCc adjusted to the threshold Vt2, respectively. The reference cells RCa/RCb/RCc are fabricated on the semiconductor chip 20 concurrently with the memory cells, and the thresholds of the reference cells RCa/RCb/RCc are regulated to Vt0/Vt1/Vt2 concurrently with the memory cells having the corresponding thresholds. For this reason, even if the process parameters fluctuate, the fluctuation equally affects the thresholds of the memory cells and the threshold of the reference cells RCa/RCb/RCc. Moreover, the reference row selector 22$d$ stepwise changes the reference word lines RWLa/RWLb/RWLc to the constant voltages VG1/VG2/VG3. Even if the constant voltage generator 21$h$ varies the constant voltages VG1/VG2/VG3 from the designed values, the influence on the channel resistance is equal between the memory cells and the reference memory cells RCa/RCb/RCc.

The reference bank selectors 22$m$/22$n$/22$p$ are implemented by arrays of n-channel enhancement type switching transistors Qn41/Qn42/Qn43/Qn44/Qn45, Qn46/Qn47/Qn48/Qn49/Qn50 and Qn51/Qn52/Qn53/Qn54/Qn55, respectively. The high voltage level H and the low voltage level L are selectively supplied to the gate electrodes of the n-channel enhancement type switching transistors Qn43 to Qn55. For this reason, main reference digit lines RMD1/RMD2/RMD3 are electrically connected through the n-channel enhancement type field effect transistors Qn41/Qn46/Qn51 and the associated sub-digit lines to the reference memory cells RCa/RCb/RCc, respectively, and the reference cells RCa/RCb/RCc are electrically connected through virtual sub-ground lines and the n-channel enhancement type switching transistors Qn45/Qn50/Qn55 to the main reference ground lines RMG11/RMG21/RMG31, respectively.

Figure 9:
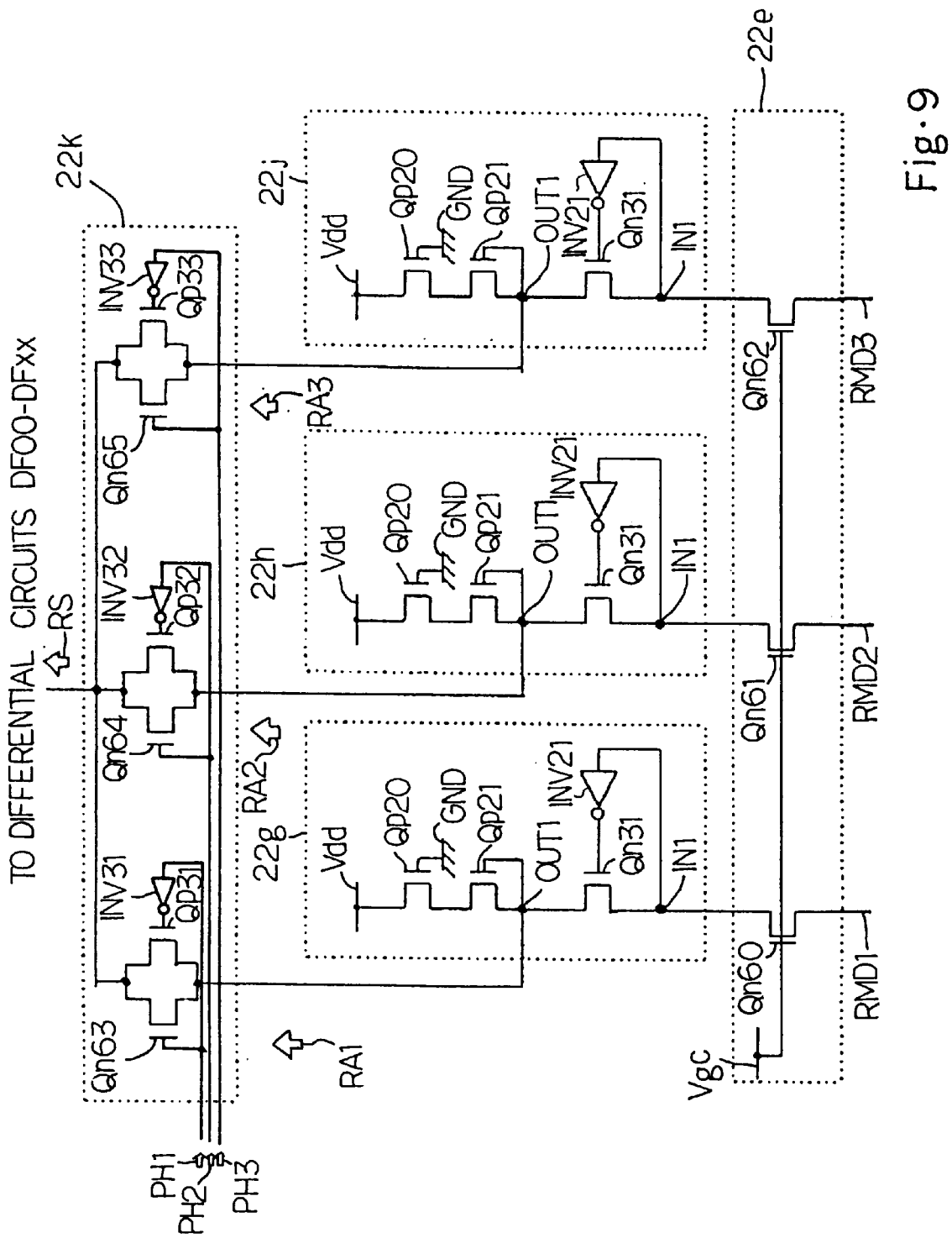
FIG. 9 is a circuit diagram showing the circuit configuration of reference amplifiers and the circuit configuration of a change-over circuit incorporated in the semiconductor multivalued read only memory device.

Turning to FIG. 9, the reference amplifiers 22$g$/22$h$/22$j$ are connected between the change-over circuit 22$k$ and the reference selector 22$e$. As described hereinbefore, the reference selector 22$e$ is basically similar in circuit configuration to the column selector 21f. Although the column address decoder 21d controls the column selector 21f through signal lines, a positive constant voltage line Vgc is connected to the gate electrodes of n-channel enhancement type field effect transistors Qn60/Qn61/Qn62 which form in combination the reference selector 22e. The positive constant voltage line Vgc is equal in potential level to the signal line driven to the active level by the column address decoder 21d, and the n-channel enhancement type field effect transistors Qn60/Qn61/Qn62 provide a channel resistance equal to the column selector 21f.

The reference amplifiers 22g/22h/22j are similar in circuit configuration to the sense amplifiers SAMP00–SAMPxx, and, for this reason, the circuit components of each reference amplifier 22g/22h/22j are labeled with corresponding circuit components of the sense amplifier SAMP00–SAMPxx without detailed description. The transistor characteristics are equal between the component transistors of the reference amplifier 22g/22h/22j and the component transistors of the sense amplifier SAM00–SAMxx. For this reason, the reference amplifiers 22g/22h/22j produce sense signals RA1/RA2/RA3 representative of the potential levels on the main reference digit lines RMD1/RMD2/RMD3, respectively, and the sense signals RA1/RA2/RA3 are approximately equal in potential level to the sense signals SA00–SAxx for the memory cell having the threshold Vt0, the memory cell having the threshold Vt1 and the memory cell having the threshold Vt2, respectively.

The change-over circuit 22k includes three transfer gates connected between the reference amplifiers 22g/22h/22j and the differential circuits DF00–DFxx and inverters INV31/INV32/INV33. Each of the transfer gates is implemented by a parallel combination of an n-channel enhancement type field effect transistor Qn63/Qn64/Qn65 and a p-channel enhancement type field effect transistor Qp31/Qp32/Qp33. The timing signals PH1/PH2/PH3 are directly supplied to the gate electrodes of the n-channel enhancement type field effect transistors Qn63–Qn65, and are supplied through the inverters INV31/INV32/INV33 to the gate electrodes of the p-channel enhancement type field effect transistors Qp31/Qp32/Qp33. For this reason, the transfer gates Qn63/Qp31, Qn64/Qp32 and Qn65/Qp33 sequentially turn on, and the change-over circuit 22k stepwise adjusts the potential level of the reference signal RS to those of the sense signals RA1/RA2/RA3. The total resistance from the output node OUT1 of the reference amplifiers 22g/22h/22j to the ground line is designed to be approximately equal to the total resistance from the output node OUT1 of the sense amplifiers SAM00–SAMxx to the ground line, and the channel resistance of the transfer gates Qn63/Qp31, Qn64/Qp32, Qn65/Qp33 is negligible. Thus, the sense signals SA00–SAxx representative of the change to the on-state are equal in potential level to the reference signal RS.

The converters CV00–CVxx are similar to those of the prior art semiconductor multivalued read only memory device, and no further description is incorporated hereinbelow.

The semiconductor multivalued read only memory device behaves as follows. The external device (not shown) is assumed to supply the bank/row/column addresses indicative of the memory cell Cn3 (see FIG. 5) to the semiconductor multivalued read only memory device. The column selector 21f/21g connect the sense amplifier SAM00 and the ground line to the main digit line MD1 and the main virtual ground line MG1, respectively, and the bank selector 21e connects the main digit line MD1 and the main virtual ground line MG1 to the sub-digit line SD02 and the virtual sub-ground line SG02. The adjacent main virtual ground line MG2 is precharged so that the elongated impurity regions for the memory cells Cn5/Cn6/Cn7/ . . . do not serve as a load.

The row address decoder 21c selects the word line WL0n, and stepwise changes the selected word line WL0n to the constant voltage levels VG1/VG2/VG3. As a result, electric current flows from the sense amplifier SAM00 through the selected memory cell Cn3 to the ground line as indicated by the arrow AR1 in FIG. 6.

Figure 10:
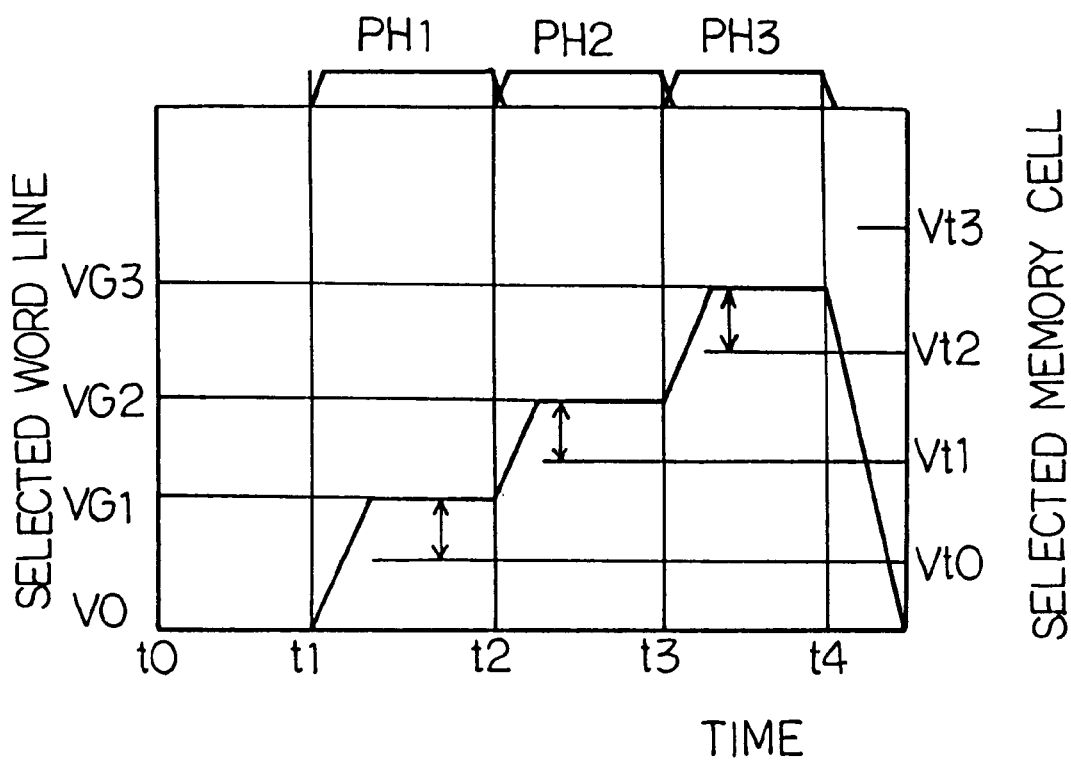
FIG. 10 is a graph showing potential variation on a selected word line.

FIG. 10 illustrates the potential level on a selected word line WL. The selected word line WL0n starts to rise to the constant voltage level VG1 at time t1, to the constant voltage level VG2 at time t2 and to the constant voltage level VG3 at time t3. In order to keep the margin dV0 constant, the constant voltage level VG1/VG2/VG3 and the threshold Vt0/Vt1/Vt2 are designed to satisfy the following relation.

$$dV0 = VG1-Vt0 = VG2-Vt1 = VG3-Vt2$$

Figure 11:
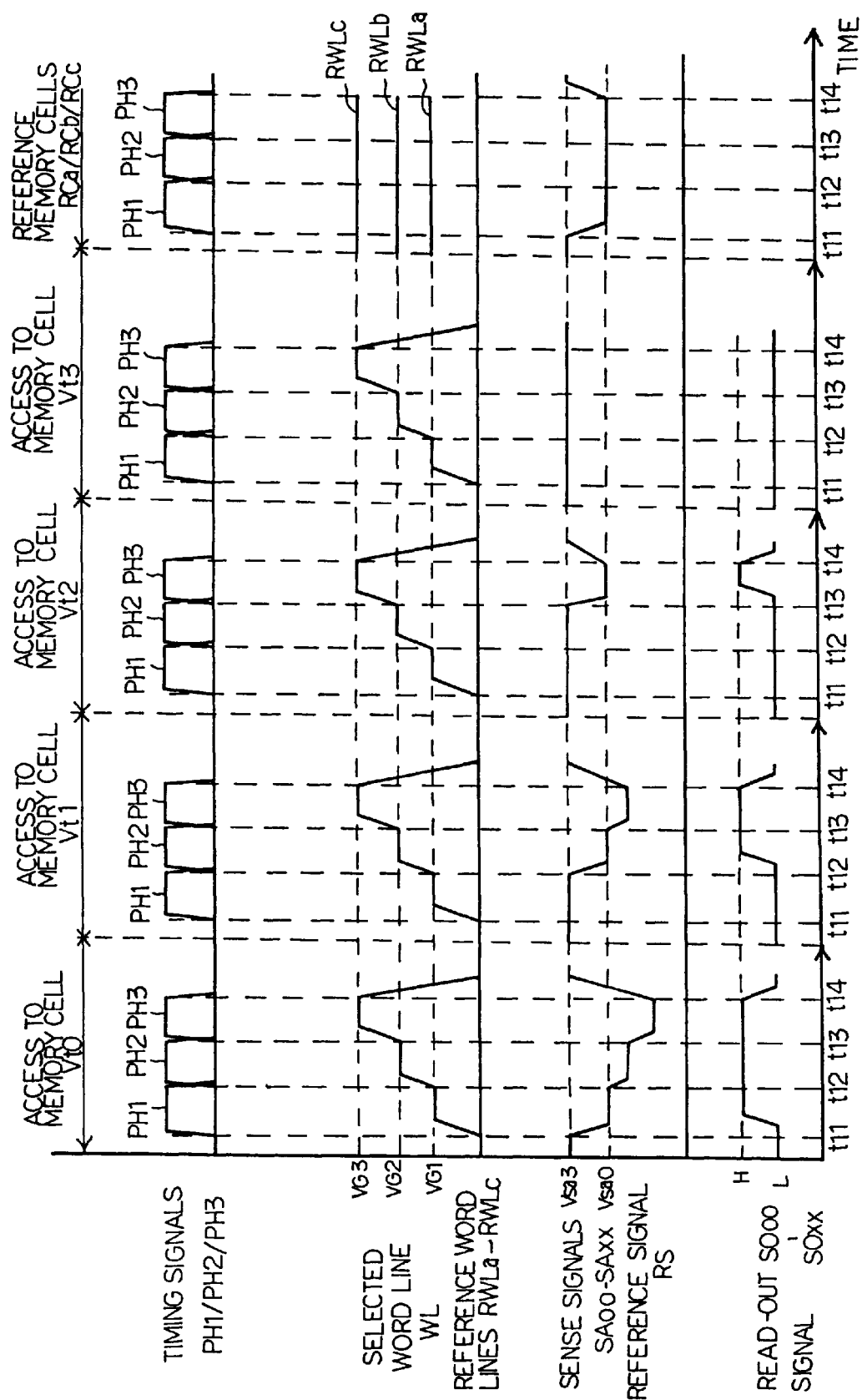
FIG. 11 is a graph showing essential signal waveforms observed in an excellent product of the semiconductor multivalued read only memory device.

If the memory cells and the reference cells RCa/RCb/RCc are correctly adjusted to the thresholds Vt0/Vt1/Vt2/Vt3, the access to the memory cells proceeds as shown in FIG. 11. The selected word line WL is stepwise changed through the contact voltage levels VG1/VG2 to the constant voltage level VG3, and the reference word lines RWLa/RWLb/RWLc are sequentially changed to the constant voltage levels VG1/VG2/VG3 at time t11, time t12 and time t13, respectively.

The potential difference between the reference cells RCa/RCb/RCc and the reference word lines RWLa/RWLb/RWLc is constant from time t11 to time t14, and the total resistance along the current path is equal between the data storage section 21 and the reference voltage generator 22. The memory cell at the threshold Vt0 allows the electric current to flow therethrough, and the amount of the electric current is equal to that flowing through the reference cell RCa. Similarly, the memory cell at the threshold Vt1 allows the electric current to flow therethrough, and the amount of current is equal to that flowing through the reference cell RCb. The memory cell at the threshold Vt2 allows the electric current to flow therethrough, and the amount of current is equal to that flowing through the reference cell RCc. In this instance, the reference voltage generator 22 keeps the reference signal RS at a constant level Vsa0, because the electric current flowing through the reference cells RCa/RCb/RCc are equal to one another.

The memory cell at the threshold Vt0 turns on at time t11 and the sense signal SA00–SAxx is changed to the voltage level Vsa0. Then, the differential circuit DF00–DFxx admits that the sense signal SA00–SAxx becomes equal in potential level to the reference signal RS, and changes the read-out signal SO00–SOxx to the high level H immediately after time t11. The sense signal SA00–SAxx is stepwise pulled down at time t12 and at time t13 due to the potential level on the selected word line WL, and the differential circuit DF00–DFxx keeps the read-out signal SO00–SOxx at the high level.

The memory cell at the threshold Vt1 turns on at time t12, and the sense signal SA00–SAxx is changed to the voltage level Vsa0. Then, the differential circuit DF00–DFxx admits that the sense signal SA00–SAxx becomes equal in potential level to the reference signal RS, and changes the read-out signal SO00–SOxx to the high level H immediately after time t12. The sense signal SA00–SAxx is pulled down at time t13 due to the potential level on the selected word line WL, and the differential circuit DF00–DFxx keeps the read-out signal SO00–SOxx at the high level.

The memory cell at the threshold Vt2 turns on at time t13, and the sense signal SA00–SAxx is changed to the voltage level Vsa0. Then, the differential circuit DF00–DFxx admits that the sense signal SA00–SAxx becomes equal in potential level to the reference signal RS, and changes the read-out signal SO00–SOxx to the high level H immediately after time t13. However, the memory cell at the threshold Vt3 does not turn on, and the sense signal SA00–SAxx is maintained at the voltage level Vsa3. For this reason, the differential circuit DF00–DFxx keeps the read-out signal SO00–SOxx at the low level L.

Thus, the differential circuits DF00–DFxx surely discriminates the read-out data, and the semiconductor multivalued read only memory device does not deliver any two-bit output data signal representative of a datum different from the read-out datum.

Figure 12:
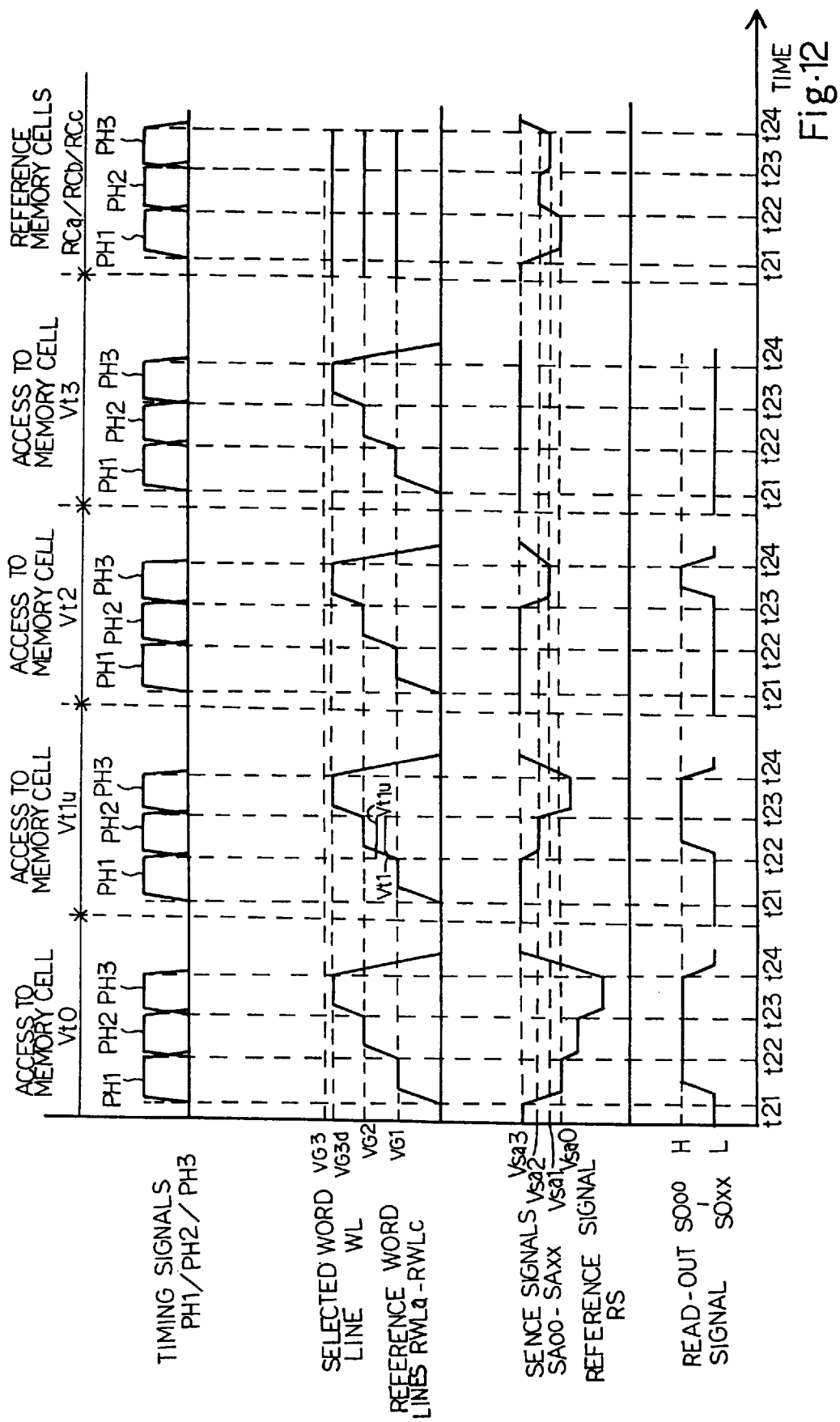
FIG. 12 is a graph showing the essential signal waveforms observed in another product of the semiconductor multivalued read only memory device.

Even if the threshold Vt0/Vt1/Vt2/Vt3 and/or the constant voltage VG1/VG2/VG3 is deviated from the designed value, the semiconductor multivalued read only memory device correctly discriminates the read-out data. FIG. 12 illustrates the data read-out from a product of the semiconductor multivalued read only memory device. In the semiconductor multivalued read only memory device, the threshold Vt1 is unintentionally changed to a higher level Vt1u, and the constant voltage generator 21h generates a constant voltage VG3d lower than the designed level VG3.

When the external device accesses the memory cell at the threshold Vt0 and the memory cell at the threshold Vt3, the sense signals SA00–SAxx and the read-out signals SO00–SOxx are similar to those shown in FIG. 11, and description is omitted for the sake of simplicity.

The external device is assumed to the memory cell at the threshold Vt1u due to fluctuation in the fabrication process. While the selected word line WL is in the constant voltage level VG1, the memory cell is turned off, and the sense amplifier SAM00–SAMxx supplies the high level Vsa3 to the high level Vsa3 to the differential circuit DF00–DFxx, and the reference signal RS is in the low level Vsa0. The differential circuit DF00–DFxx determines the sense signal SA00–SAxx to be higher than the reference signal RS, and keeps the read-out signal SO00–SOxx in the low level. The selected word line WL is changed to the constant voltage level VG2 at time t22, and the selected memory cell turns on. The potential difference between the threshold Vt1u and the word line WL is less than dV0, and the sense signal SA00–SAxx is regulated to an intermediate level Vsa2 higher than the low level Vsa0. However, the fluctuation also changes the reference cell RCb to the threshold Vt1u, and the reference signal generator 22 regulates the reference signal RS to the intermediate level Vsa2. For this reason, the differential circuit DF00–DFxx admits that the sense amplifier SAM00–SAMxx pulls down the sense signal SA00–SAxx to the potential level of the reference signal RS, and changes the read-out signal SO00–SOxx to the high level H. Thus, the semiconductor multivalued read only memory device is free from the undesirable deviation of the threshold from Vt1 to Vt1u.

Subsequently, the external device is assumed to access the memory cell at the threshold Vt2. While the word line WL is in the constant voltage levels VG1 and VG2, the selected memory cell is turned off, and the sense amplifier SAM00–SAMxx keeps the sense signal SA00–SAxx at the high level. The differential amplifier DF00–DFxx keeps the read-out signal SO00–SOxx at the low level L. The selected word line WL is changed to the constant voltage level VG3d at time t23, and the selected memory cell turns on. The potential difference between the threshold Vth2 and the word line WL is less than dV0 due to the malfunction of the constant voltage generator 21h. However, the reference word line RWLc is also driven to the constant voltage level VG3d, and the potential difference between the reference word line RWLc and the reference cell RCc is also less than dV0. Both of the sense signal SA00–SAxx and the reference signal RS are regulated to an intermediate potential level Vsa2, and the differential circuit DF00–DFxx admits that the sense signal SA00–SAxx is equal in potential level to the reference signal RS. As a result, the differential circuit DF00–DFxx changes the read-out signal SO00–SOxx to the high level H. Thus, the semiconductor multivalued read only memory device is free from the malfunction of the constant voltage generator 21h.

Even if the other thresholds and the other constant voltages are deviated, the semiconductor multivalued read only memory device can correctly discriminate the read-out data.

As will be understood from the foregoing description, the fluctuation of process parameters and the malfunction of the constant voltage generator 21h equally affect the memory cells and the reference cells RCa/RCb/RCc, and the differential circuits DF00–DFxx correctly discriminate the read-out data.

In this instance, the band address decoder 21b, the row address decoder 21c, the column address decoder 21d, the bank selector 21e, the column selectors 21f/21g, the sense amplifiers SAM00–SAMxx and the word lines WL as a whole constitute an addressing circuit, and the constant voltage generator 21h, the voltage selector 21j, differential circuits DF00–DFxx and the converters CV00–CVxx form in combination a data discriminator.

Second Embodiment

Figure 13:
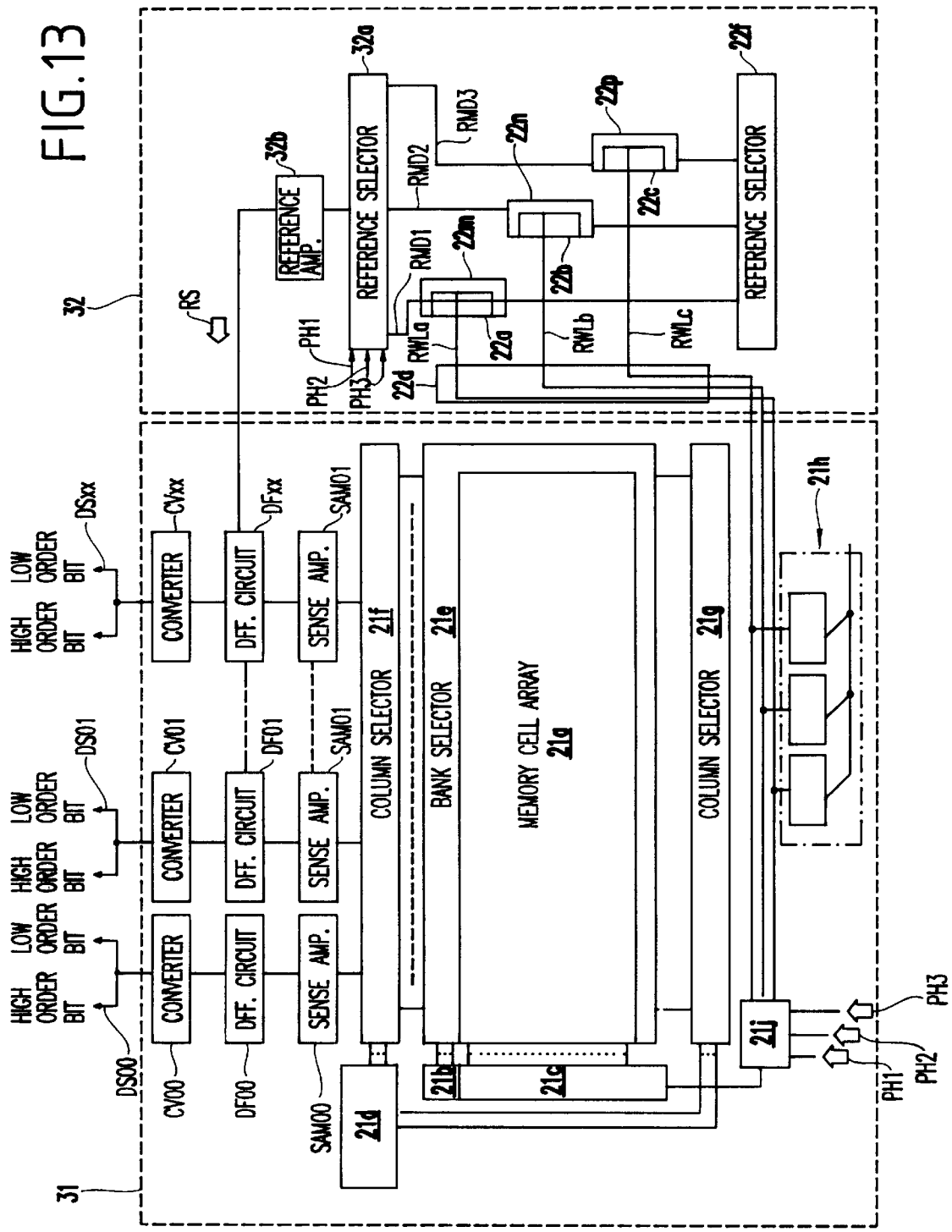
FIG. 13 is a block diagram showing the arrangement of another semiconductor multivalued read only memory device according to the present invention.

Turning to FIG. 13, another semiconductor multivalued read only memory device embodying the present invention largely comprises a data storage section 31 and a reference signal generator 32. The data storage section 31 is similar in arrangement to the data storage section 21, and the components are labeled with the same references designating corresponding components in FIG. 4 without detailed description.

Figure 14:
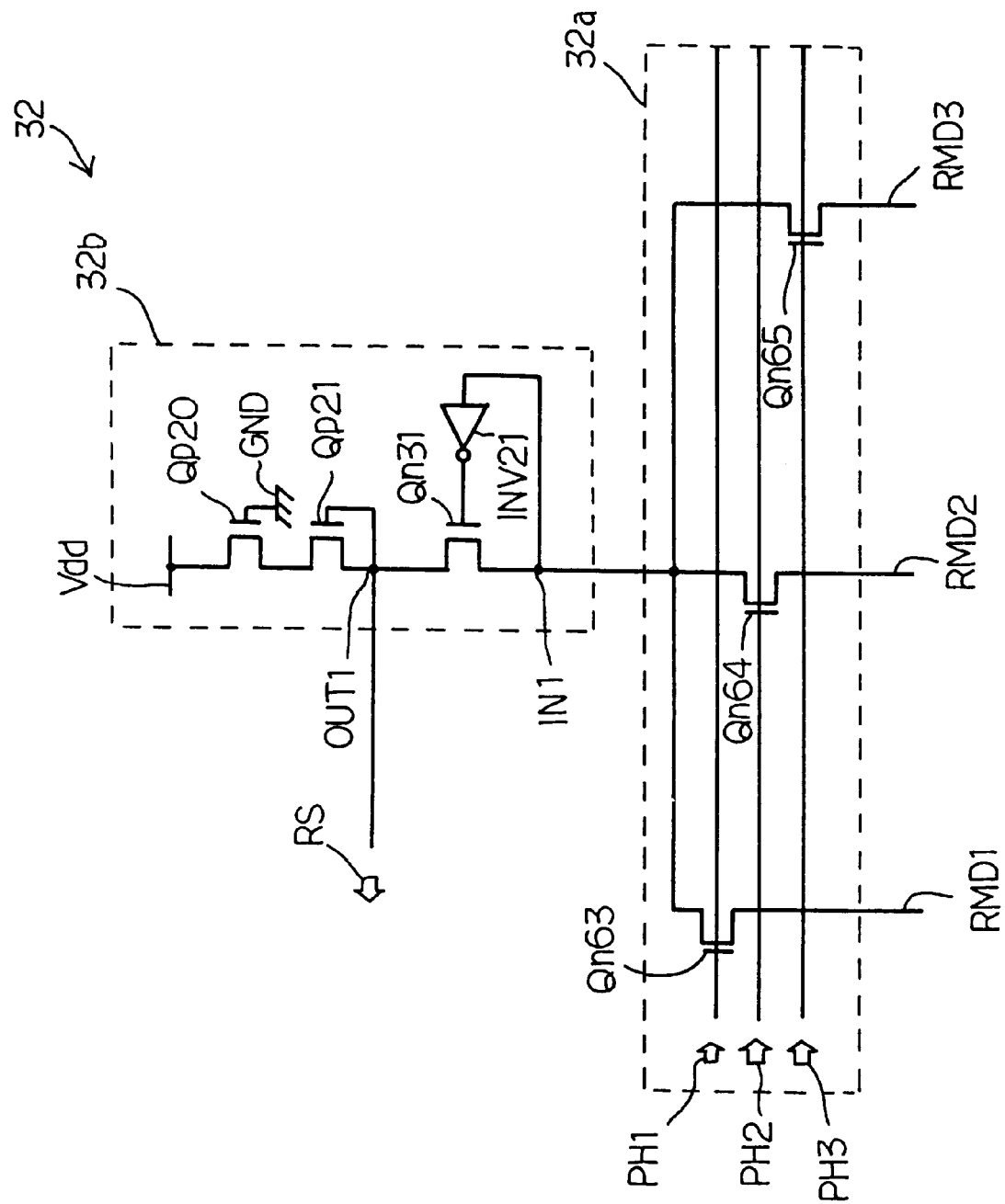
FIG. 14 is a circuit diagram showing the circuit configuration of a reference selector and the circuit configuration of a reference sense amplifier incorporated in the semiconductor multivalued read only memory device.

The reference signal generator 32 is similar to the reference signal generator 22 except a reference selector 32a and a reference amplifier 32b. For this reason, the other components are labeled with the same references designating corresponding components of the reference signal generator 22. The reference selector 32a and the reference amplifier 32b are illustrated in FIG. 14 in detail. The reference amplifier 32b is similar in circuit configuration to the reference amplifiers 22g/22h/22j, and, for this reason, the circuit components of the sense amplifier 32b are designed by the same references assigned to the corresponding circuit components of the reference amplifiers 22g/22h/22j.

N-channel enhancement type field effect transistors Qn63/Qn64/Qn65 form the reference selector 32a. The n-channel enhancement type field effect transistors Qn63/Qn64/Qn65 are connected between the input node IN1 and the main reference digit lines RMD1/RMD2/RMD3, and the timing signals PH1/PH2/PH3 are respectively applied to the gate electrodes of the n-channel enhancement type field effect transistors Qn63/Qn64/Qn65. When the timing signal PH1 is changed to the active level, the reference sense amplifier 32b is electrically connected through the main reference digit line RMD1 to the reference cell array 22a. Similarly, the timing signals RH2/RH2 are sequentially changed to the active level, and the reference sense amplifier 32b is successively connected through the main reference digit lines RMD2/RMD3 to the reference cell arrays 22b/22c. The reference signal generator 32 requires only one reference selector 32b, and any change-over circuit is not incorporated in the reference signal generator 32. Thus, the reference signal generator 32 is simpler in circuit arrangement than the reference signal generator 22, and the electric current consumption is reduced.

Third Embodiment

Figure 15:
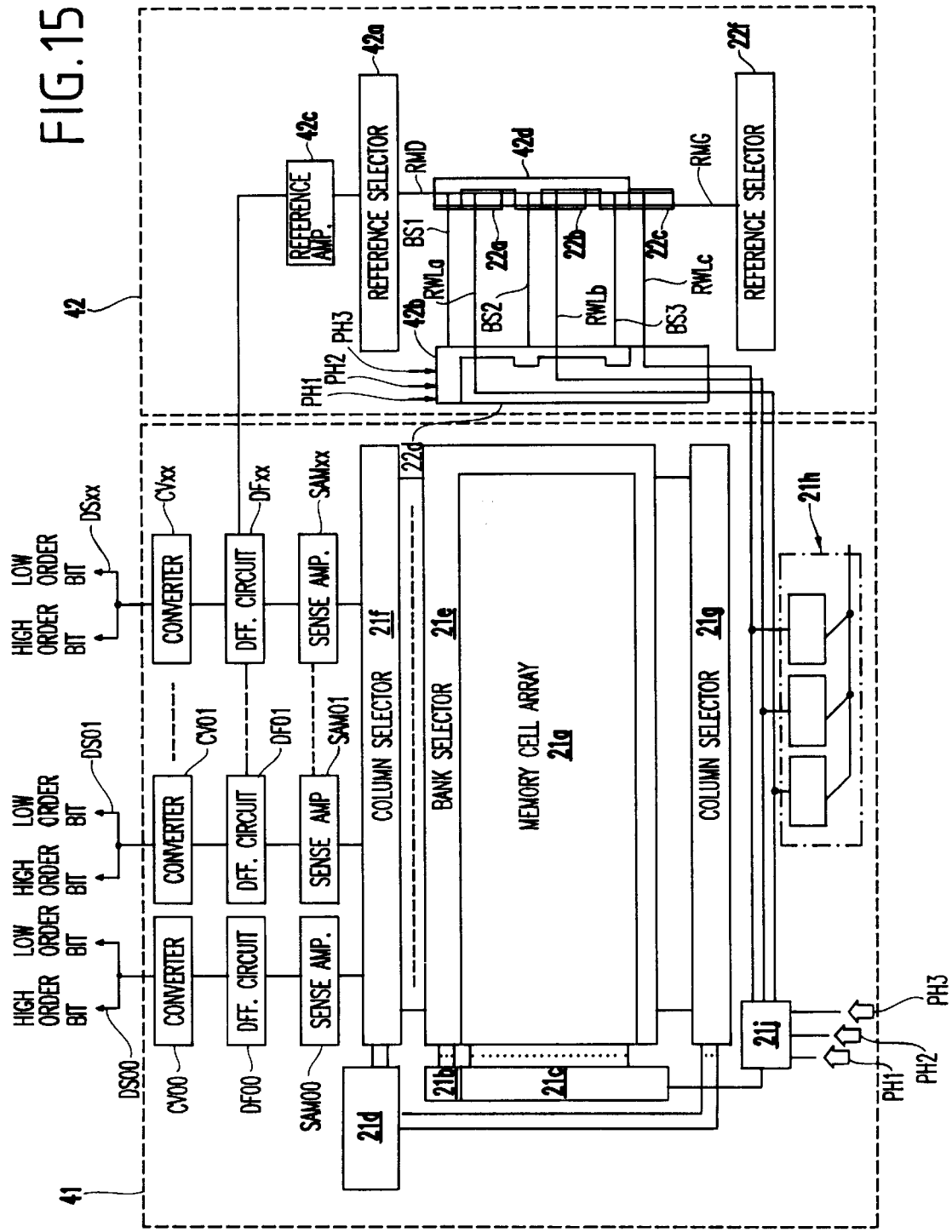
FIG. 15 is a block diagram showing the arrangement of yet another semiconductor multivalued read only memory device according to the present invention.

Referring to FIG. 15 of the drawings, yet another semiconductor multi-valued read only memory device largely comprises a data storage section 41 and a reference signal generator 42. The data storage section 41 is similar in arrangement to the data storage section 21, and the reference signal generator 42 is similar to the reference signal generator 22 except a reference selector 42a, a reference bank decoder 42b, a reference amplifier 42c and a reference selector 42d. For this reason, description is focused on the different circuits 42a/42b/42c/42d, and the other circuit components are labeled with the same references designating corresponding circuit components of the first embodiment without detailed description.

The timing signals PH1/PH2/PH3 are supplied to the reference bank decoder 42b, and the reference bank decoder 42b is connected through reference bank select lines BS1/BS2/BS3 to the reference bank selector 42d. The reference bank decoder 42b is responsive to the timing signals PH1/PH2/PH3 so as to sequentially changing reference bank select lines BS1/BS2/BS3 to the active level.

Figure 16:
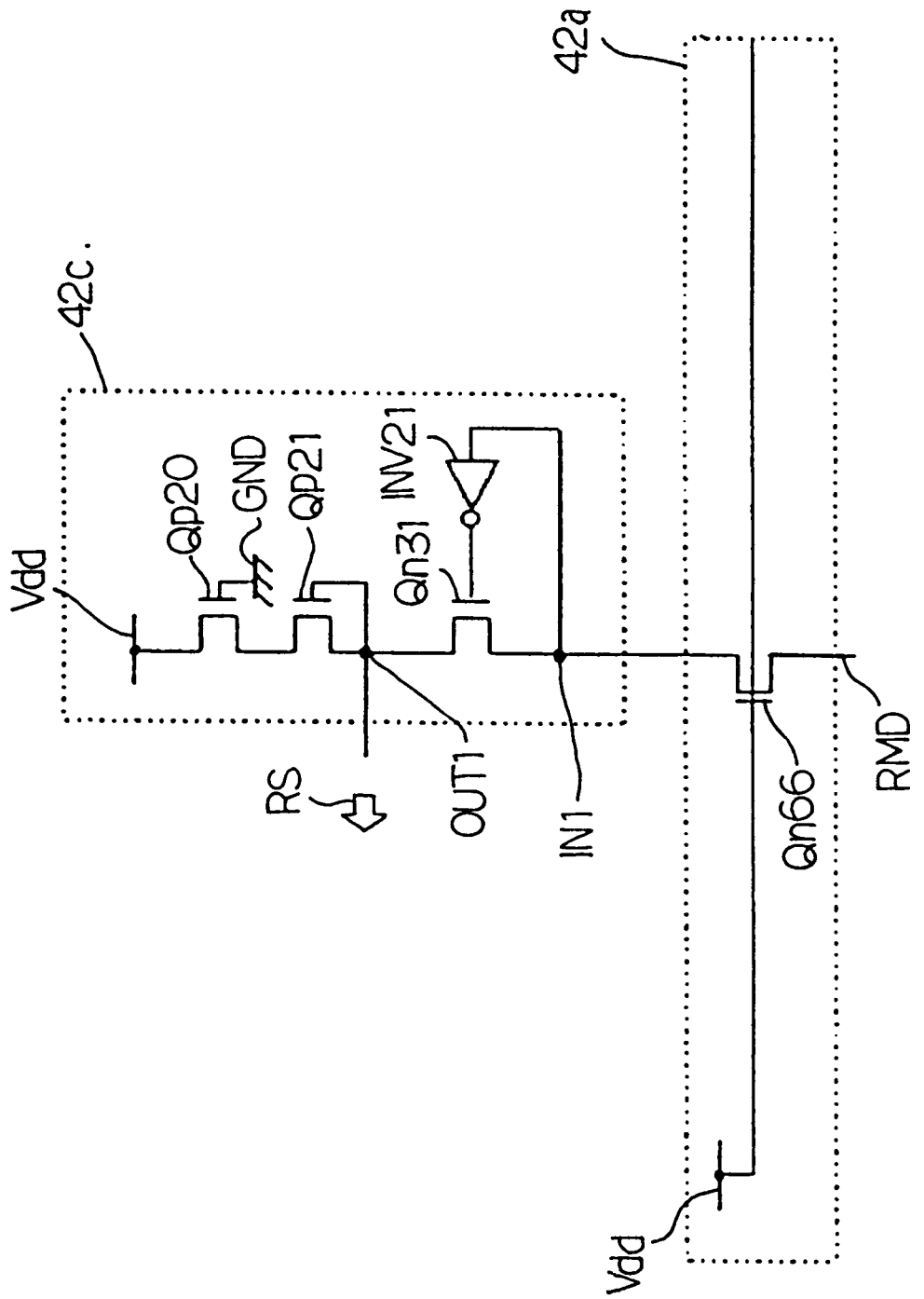
FIG. 16 is a circuit diagram showing the circuit configuration of a reference selector and the circuit configuration of a reference sense amplifier incorporated in the semiconductor multivalued read only memory device.

As shown in FIG. 16, the reference amplifier 42b is similar in circuit configuration to the reference amplifiers 22g/22h/22j, and, for this reason, the circuit components of the sense amplifier 42b are designed by the same references assigned to the corresponding circuit components of the reference amplifiers 22g/22h/22j.

The reference selector 42a is implemented by a single n-channel enhancement type field effect transistor Qn66. The n-channel enhancement type field effect transistor Qn66 is connected between the input node IN1 and a main reference digit line RMD, and the positive voltage is supplied from the positive power supply line Vdd to the gate electrode of the n-channel enhancement type field effect transistor Qn66. The n-channel enhancement type field effect transistor Qn66 is turned on at all times, and provides the resistance equal to that of the column selector 21f.

Figure 17:
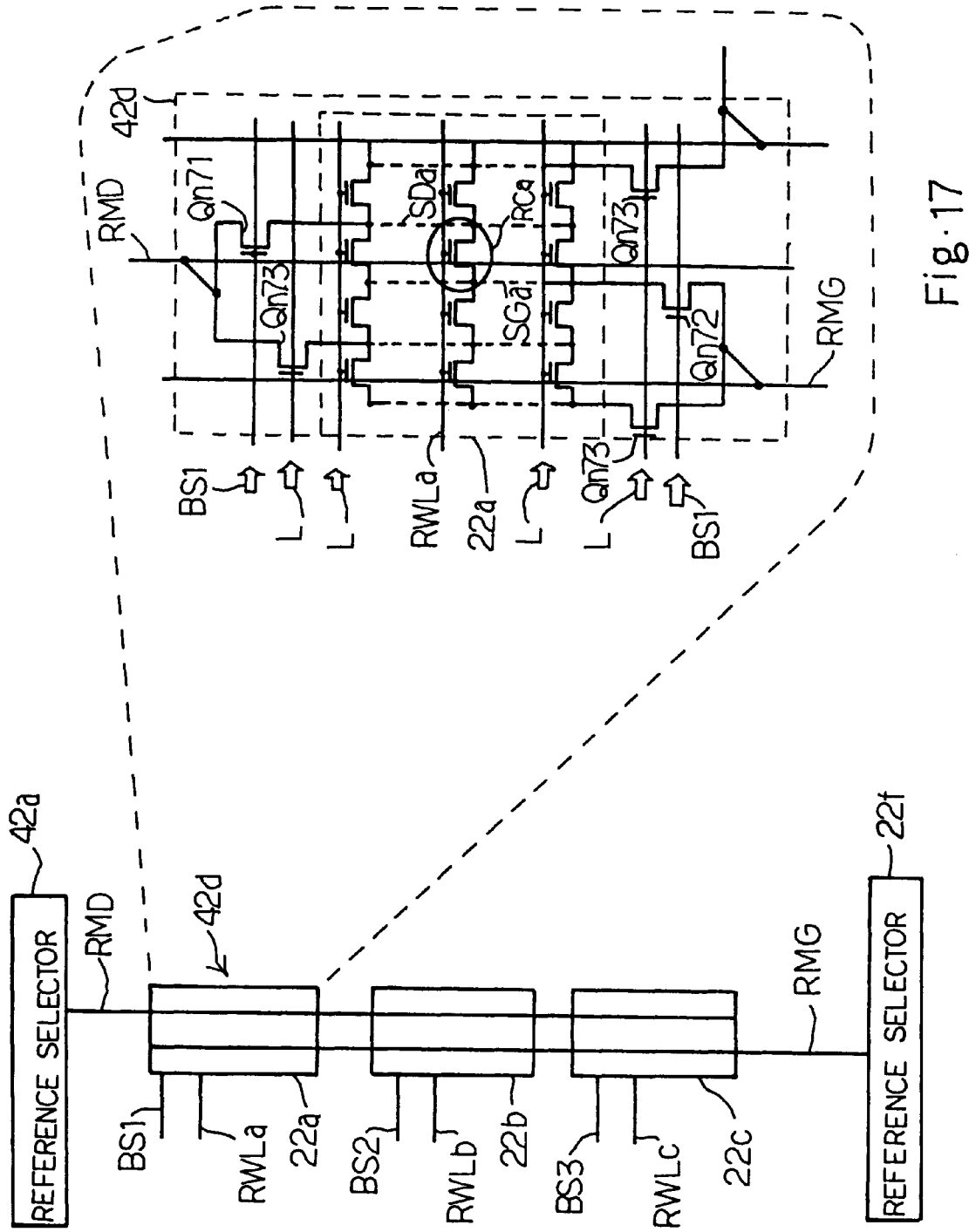
FIG. 17 is a circuit diagram showing the circuit arrangement of a reference cell array and associated part of a reference bank selector.

Turning to FIG. 17 of the drawings, the main reference digit line RMD and a main virtual ground line RMG are shared between the reference cell arrays 22a/22b/22c. The reference cell array 22a and an associated part of the reference bank selector 42d are similar to the other reference cell arrays 22b/22c and the associated parts. For this reason, description is made on the reference cell array 22a and the associated part of the reference bank selector 42d. The reference cell array 22a contains a reference cell RCa, and the threshold of the reference cell RCa is adjusted to Vt0. The other reference cell arrays 22b/22c have a reference cell adjusted to the threshold Vt1 and a reference cell adjusted to the threshold Vt2, respectively.

The reference cell RCa is connected between a reference sub-digit line SDa and a reference virtual sub-ground line SGa, and the reference word line RWLa is connected to the gate electrode of the reference cell RCa.

The reference bank selector 42d has an n-channel enhancement type field effect transistor Qn71 connected between the main reference digit line RMD and the reference sub-digit line SDa, an n-channel enhancement type field effect transistor Qn72 connected between the reference virtual sub-ground line SGa and the main reference virtual ground line RMG and other n-channel enhancement type field effect transistors Qn73 connected between the main reference digit line/reference main virtual ground line RMD/RMG and other reference sub-digit lines/reference virtual sub-ground lines. The reference bank select line BS1 is connected to the gate electrodes of the n-channel enhancement type field effect transistors Qn71/Qn72, and the low level is supplied to the gate electrodes of the other n-channel enhancement type field effect transistors Qn73. Thus, the other n-channel enhancement type field effect transistors Qn73 are turned off at all times.

As described hereinbefore, the reference bank decoder 42b sequentially changes the reference bank select lines BS1/BS2/BS3 to the active high level in response to the timing signals PH1/PH2/PH3, respectively. The active high level on the reference bank select line BS1 makes the reference bank selector 42d connect the main reference digit line RMD and the main reference virtual ground line RMG to the reference sub-digit line SDa and the reference virtual sub-ground line Sga, respectively. The constant voltage level VG1 on the reference word line RWLa causes the reference cell RCa to turn on, and the electric current flows from the reference sub-digit line SDa to the reference virtual sub-ground line SGa. Similarly, the electric current flows through the reference cell RCb at the change of the timing signal PH2 to the active high level, and through the reference cell RCc at the change of the timing signal PH3 to the active high level.

Thus, the reference signal generator 42 requires only one reference sense amplifier 42c and the simple reference selector 42a, and the occupation area and the electric power consumption are reduced.

Fourth Embodiment

Figure 18:
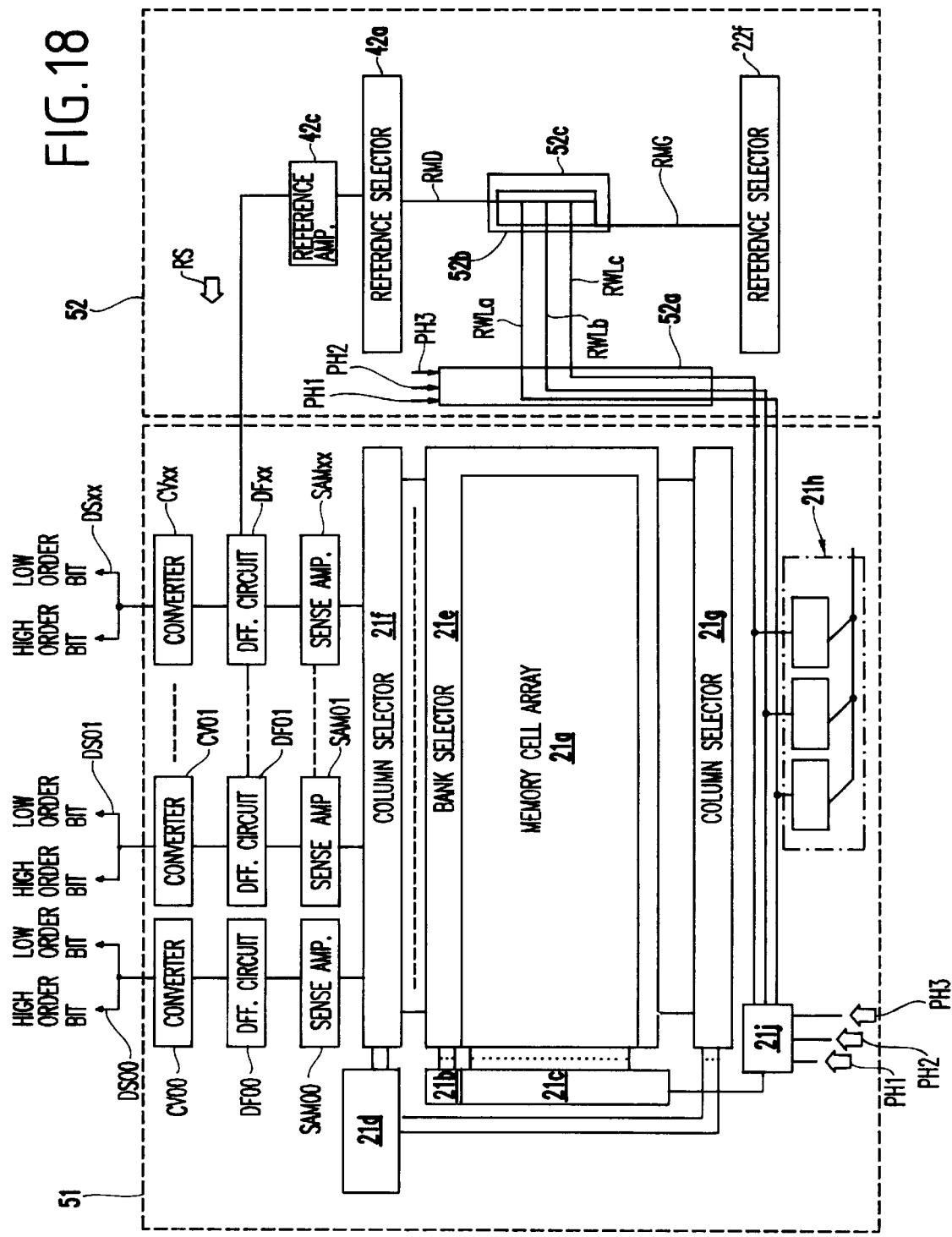
FIG. 18 is a block diagram showing the arrangement of still another semiconductor multivalued read only memory device according to the present invention.

Referring to FIG. 18 of the drawings, still another semiconductor multi-valued read only memory device embodying the present invention largely comprises a data storage section 51 and a reference signal generator 52. The semiconductor multivalued read only memory device is similar to the third embodiment except a reference row selector 52a and a reference cell array 52b. For this reason, description is made on the different components 52a/52b, and other components are labeled with the same references designating corresponding components of the third embodiment.

Figure 19:
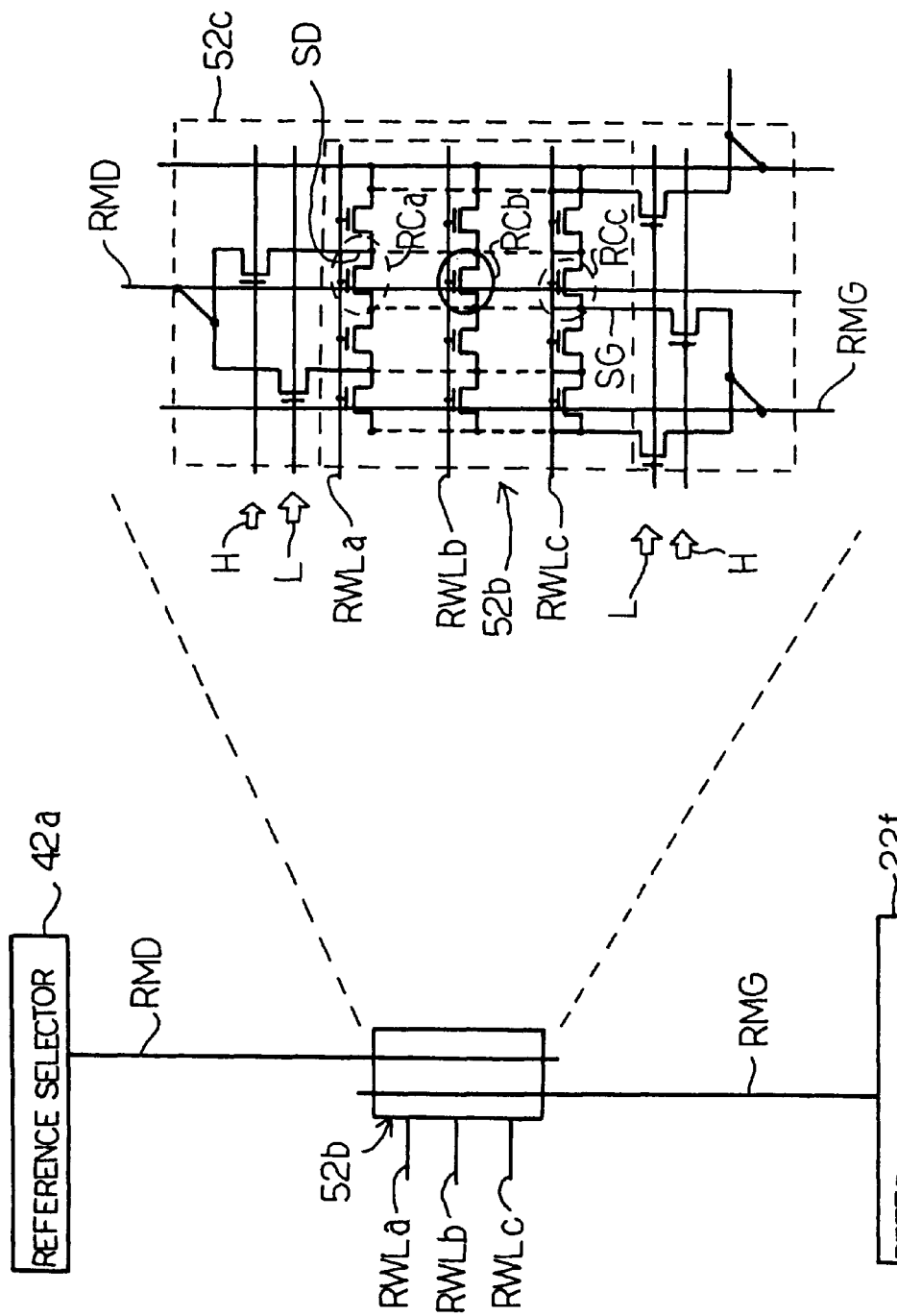
FIG. 19 is a circuit diagram showing the circuit arrangement of a reference cell array and associated part of a reference bank selector incorporated in the semiconductor multivalued read only memory device.

The reference cell array 52b is illustrated in FIG. 19 in detail. The reference cell array 52b has rows of reference cells, and reference cells RCa/RCb/RCc form parts of the rows, respectively. The reference cells RCa/RCb/RCc have thresholds Vt0/Vt1/Vt2, respectively, and the reference word lines RWLa/RWLb/RWLc are connected to the gate electrodes of the reference cells RCa/RCb/RCc, respectively. A reference sub-digit line SD is connected to the drain nodes of the reference cells RCa/RCb/RCc, and reference virtual sub-ground line SG is connected to the source nodes of the reference cells RCa/RCb/RCc. The main reference digit line RMD is connected through a reference bank selector 52c to the reference sub-digit line SD, and the reference virtual sub-ground line SG is connected through the reference bank selector 52c to the main virtual ground line RMG. For this reason, the electric current reaches the reference sub-digit line SD.

The reference row selector 52a is shown in FIG. 20 in detail. The reference row selector 52a includes three transfer gates 52d/52e/52f respectively connected to the reference word lines RWLa/RWLb/RWLc and n-channel enhancement type discharging transistors Qn70/Qn71/Qn72 connected between the reference word lines RWLa/RWLb/RWLc and the ground line GND. The transfer gates 52d/52e/52f have n-channel enhancement type field effect transistors Qn73/Qn74/Qn75 and p-channel enhancement type field effect transistors Qp73/Qp74/Qp75 respectively paired with the n-channel enhancement type field effect transistors Qn73/Qn74/Qn75. The constant voltage generator 21h supplies the constant voltages VG1/VG2/VG3 to the transfer gates 52d/52e/52f, and the timing signals PH1/PH2/PH3 are supplied to the gate electrode of the n-channel enhancement type field effect transistor Qn73/the inverter INV50, the gate electrode of the n-channel enhancement type field effect transistor Qn74/the inverter INV51 and the gate electrode of the n-channel enhancement type field effect transistor Qn75/the inverter INV52, respectively. The inverters INV50/INV51/INV52 supplies the inverted signals of the timing signals PH1/PH2/PH3 to the gate electrodes of the p-channel enhancement type field effect transistors Qp73/Qp74/Qp75 and the gate electrodes of the n-channel enhancement type discharging transistors Qn70/Qn71/Qn72.

When the timing signal PH1 rises to the high level, the transfer gate 52d and the n-channel enhancement type discharging transistors Qn71/Qn72 turn on, and the other transfer gates 52e/52f and the n-channel enhancement type discharging transistor Qn70 turn off. As a result, the word line RWLa rises to the constant voltage level VG1, and the other word lines RWLb/RWLc fall to the ground level as shown in FIG. 21.

When the timing signal PH2 rises to the high level, the transfer gate 52e and the n-channel enhancement type discharging transistors Qn70/Qn72 turn on, and the other transfer gates 52d/52f and the n-channel enhancement type discharging transistor Qn71 turn off. As a result, the word line RWLb rises to the constant voltage level VG2, and the other word lines RWLa/RWLc fall to the ground level.

When the timing signal PH3 rises to the high level, the transfer gate 52f and the n-channel enhancement type discharging transistors Qn70/Qn71 turn on, and the other transfer gates 52d/52e and the n-channel enhancement type discharging transistor Qn72 turn off. As a result, the word line RWLc rises to the constant voltage level VG3, and the other word lines RWLa/RWLb fall to the ground level.

Thus, the reference signal generator 52 sequentially changes the reference signal RS to the potential level Vsa0 at the timing signal PH1, the potential level Vsa1 at the timing signal PH2 and the potential level Vsa2 at the timing signal PH3. The semiconductor multivalued read only memory device achieves all the advantages of the first embodiment, and the occupation area is further reduced rather than the third embodiment by virtue of the single reference cell array 52b.

As will be appreciated from the foregoing description, the semiconductor multivalued memory device is free from the fluctuation in the thresholds and the trouble of the constant voltage generator 21h, and the output data signals DS00–DSxx are reliable.

Although particular embodiments of the present invention have been shown and described, it will be apparent to those skilled in the art that various changes and modifications may be made without departing from the spirit and scope of the present invention.

For example, the reference voltage generator is applicable to any kind of semiconductor multivalued memory device. The multivalued data may be stored after completion of the semiconductor multivalued memory device. A modification may store the multivalued data by changing the amount of electric charges accumulated in a floating gate electrode. The memory cells and the reference memory cells may store multivalued data in the form of electric charge.

The read-only memory cells may store data selectively given more than four values.

What is claimed is:

1. A semiconductor multivalued memory device comprising:

a memory cell array including plural memory cells for storing pieces of data information selectively representing a plurality of values;

an addressing circuit having selecting lines selectively connected to said plural memory cells, and driving at least one of said selecting lines so as to read out said pieces of data information at different timings corresponding to said plurality of values;

a reference signal generator including plural reference cells for storing pieces of reference data information respectively representing at least two of said plurality of values, said reference signal generator further including reference selecting lines respectively connected to said plural reference cells, said reference selecting lines being selectively driven for reading out said pieces of reference data information at timings selected from said different timings and corresponding to said at least two of said plurality of values; and a data discriminator connected to said memory cell array and said reference signal generator, and determining a value of each piece of data information read out from said memory cell array on the basis of said pieces of reference data information so as to produce an output data signal, wherein said plural memory cells and said plural reference cells are implemented by field effect transistors, and said plurality of values are respectively corresponding to different thresholds selectively given to the field effect transistors forming said memory cell array and the field effect transistors respectively serving as said reference cells, said addressing circuit providing a first current path from said data discriminator to selected field effect transistors connected to said at least one of said selecting lines, said addressing circuit sequentially changing said at least one of said selecting lines to different active levels between said different thresholds at said timings to see whether a first electric current flows from said first current path through said selected field effect transistors at said timings, said reference signal generator sequentially providing a second current path to the field effect transistors respectively serving as said reference cells at said timings, and sequentially changing said reference selecting lines to said different active levels at said timings so as to sequentially vary the amount of a second current flowing through said second current path to said field effect transistors serving as said reference cells, wherein said data discriminator includes a constant voltage generator generating said different active levels sequentially supplied through said addressing circuit to said at least one of said selecting lines and selectively supplied to said reference selecting lines, said data discriminator further including a comparator comparing the amount of said first electric current with said amount of said second current so as to determine said value of said each piece of data information, wherein said second current path includes a first portion formed in each of plural sub-digit lines respectively connected to channels of said field effect transistors serving as said reference cells, a second portion formed in each of reference selectors respectively connected between said plural sub-digit lines and main digit lines, a third portion formed in each of said main digit lines, and a fourth portion formed in each of plural reference amplifiers serving as a current source of said second electric current and connected between said plural reference amplifiers and a change-over circuit, and said change-over circuit selectively connects said plural reference amplifiers to said comparator at said timings.

2. The semiconductor multivalued memory device as set forth in claim 1, wherein said at least one of said selecting lines is driven to different active levels at said timings, respectively, and said reference selecting lines are driven to said different active levels at said timings, respectively.

3. The semiconductor multivalued memory device as set forth in claim 1, wherein said different thresholds are selectively given to said field effect transistors during a fabrication process.

4. The semiconductor multivalued memory device as set forth in claim 1, wherein said first current path is approximately equal in resistance to said second current path, and said data discriminator determines said value of said each piece of data information to be equal to the value of one of said pieces of reference data information stored in one of said reference cells when said comparator determines that said amount of said first electric current is equal to said amount of said second electric current flowing through said one of said reference cells.

5. The semiconductor multivalued memory device as set forth in claim 1, wherein said first current path is approximately equal in resistance to said second current path, and said data discriminator determines said value of said each piece of data information to be equal to the value of one of said pieces of reference data information stored in one of said reference cells when said comparator determines that said amount of said first electric current is equal to said amount of said second electric current flowing through said one of said reference cells.

6. A semiconductor multivalued memory device comprising:

a memory cell array including plural memory cells for storing pieces of data information selectively representing a plurality of values;

an addressing circuit having selecting lines selectively connected to said plural memory cells, and driving at least one of said selecting lines so as to read out said pieces of data information at different timings corresponding to said plurality of values;

a reference signal generator including plural reference cells for storing pieces of reference data information respectively representing at least two of said plurality of values, said reference signal generator further including reference selecting lines respectively connected to said plural reference cells, said reference selecting lines being selectively driven for reading out said pieces of reference data information at timings selected from said different timings and corresponding to said at least two of said plurality of values; and a data discriminator connected to said memory cell array and said reference signal generator, and determining a value of each piece of data information read out from said memory cell array on the basis of said pieces of reference data information so as to produce an output data signal, wherein said plural memory cells and said plural reference cells are implemented by field effect transistors, and said plurality of values are respectively corresponding to different thresholds selectively given to the field effect transistors forming said memory cell array and the field effect transistors respectively serving as said reference cells, said addressing circuit providing a first current path from said data discriminator to selected field effect transistors connected to said at least one of said selecting lines, said addressing circuit sequentially changing said at least one of said selecting lines to different active levels between said different thresholds at said timings to see whether a first electric current flows from said first current path through said selected field effect transistors at said timings, said reference signal generator sequentially providing a second current path to the field effect transistors respectively serving as said reference cells at said timings, and sequentially changing said reference selecting lines to said different active levels at said timings so as to sequentially vary the amount of a second current flowing through said second current path to said field effect transistors serving as said reference cells, wherein said data discriminator includes a constant voltage generator generating said different active levels sequentially supplied through said addressing circuit to said at least one of said selecting lines and selectively supplied to said reference selecting lines, said data discriminator further including a comparator comparing the amount of said first electric current with said amount of said second current so as to determine said value of said each piece of data information, wherein said second current path includes a first portion selectively formed in plural sub-digit lines respectively connected to channels of said field effect transistors serving as said reference cells, a second portion selectively formed in first reference selectors respectively connected between said plural sub-digit lines and main digit lines, a third portion formed in one of said main digit lines, a fourth portion formed in a reference amplifier serving as a current source of said second electric current and connected to said comparator, and a fifth portion formed in a second reference selector selectively connecting said main digit lines to said reference amplifier at said timings.

7. The semiconductor multivalued memory device as set forth in claim 6, wherein said first current path is approximately equal in resistance to said second current path, and said data discriminator determines said value of said each piece of data information to be equal to the value of one of said pieces of reference data information stored in one of said reference cells when said comparator determines that said amount of said first electric current is equal to said amount of said second electric current flowing through said one of said reference cells.

8. The semiconductor multivalued memory device as set forth in claim 6, wherein said different thresholds are selectively given to said field effect transistors during a fabrication process.

9. A semiconductor multivalued memory device comprising:

a memory cell array including plural memory cells for storing pieces of data information selectively representing a plurality of values;

an addressing circuit having selecting lines selectively connected to said plural memory cells, and driving at least one of said selecting lines so as to read out said pieces of data information at different timings corresponding to said plurality of values;

a reference signal generator including plural reference cells for storing pieces of reference data information respectively representing at least two of said plurality of values, said reference signal generator further including reference selecting lines respectively connected to said plural reference cells, said reference selecting lines being selectively driven for reading out said pieces of reference data information at timings selected from said different timings and corresponding to said at least two of said plurality of values; and a data discriminator connected to said memory cell array and said reference signal generator, and determining a value of each piece of data information read out from said memory cell array on the basis of said pieces of reference data information so as to produce an output data signal, wherein said plural memory cells and said plural reference cells are implemented by field effect transistors, and said plurality of values are respectively corresponding to different thresholds selectively given to the field effect transistors forming said memory cell array and the field effect transistors respectively serving as said reference cells, said addressing circuit providing a first current path from said data discriminator to selected field effect transistors connected to said at least one of said selecting lines, said addressing circuit sequentially changing said at least one of said selecting lines to different active levels between said different thresholds at said timings to see whether a first electric current flows from said first current path through said selected field effect transistors at said timings, said reference signal generator sequentially providing a second current path to the field effect transistors respectively serving as said reference cells at said timings, and sequentially changing said reference selecting lines to said different active levels at said timings so as to sequentially vary the amount of a second current flowing through said second current path to said field effect transistors serving as said reference cells, wherein said data discriminator includes a constant voltage generator generating said different active levels sequentially supplied through said addressing circuit to said at least one of said selecting lines and selectively supplied to said reference selecting lines, said data discriminator further including a comparator comparing the amount of said first electric current with said amount of said second current so as to determine said value of said each piece of data information, wherein said second current path includes a first portion selectively formed in plural sub-digit lines respectively connected to channels of said field effect transistors serving as said reference cells, a second portion formed in a main digit line, a third portion formed in a first selector selectively connecting said plural sub-digit lines to said main digit line at said timings, a fourth portion formed in a reference amplifier serving as a current source of said second electric current and connected to said comparator, and a fifth portion formed in a second selector connected between said main digit line and said reference amplifier at all times.

10. The semiconductor multivalued memory device as set forth in claim 9, wherein said first current path is approximately equal in resistance to said second current path, and said data discriminator determines said value of said each piece of data information to be equal to the value of one of said pieces of reference data information stored in one of said reference cells when said comparator determines that said amount of said first electric current is equal to said amount of said second electric current flowing through said one of said reference cells.

11. The semiconductor multivalued memory device as set forth in claim 9, wherein said different thresholds are selectively given to said field effect transistors during a fabrication process.

12. A semiconductor multivalued memory device comprising:

a memory cell array including plural memory cells for storing pieces of data information selectively representing a plurality of values;

an addressing circuit having selecting lines selectively connected to said plural memory cells, and driving at least one of said selecting lines so as to read out said pieces of data information at different timings corresponding to said plurality of values;

a reference signal generator including plural reference cells for storing pieces of reference data information respectively representing at least two of said plurality of values, said reference signal generator further including reference selecting lines respectively connected to said plural reference cells, said reference selecting lines being selectively driven for reading out said pieces of reference data information at timings selected from said different timings and corresponding to said at least two of said plurality of values; and a data discriminator connected to said memory cell array and said reference signal generator, and determining a value of each piece of data information read out from said memory cell array on the basis of said pieces of reference data information so as to produce an output data signal, wherein said plural memory cells and said plural reference cells are implemented by field effect transistors, and said plurality of values are respectively corresponding to different thresholds selectively given to the field effect transistors forming said memory cell array and the field effect transistors respectively serving as said reference cells, said addressing circuit providing a first current path from said data discriminator to selected field effect transistors connected to said at least one of said selecting lines, said addressing circuit sequentially changing said at least one of said selecting lines to different active levels between said different thresholds at said timings to see whether a first electric current flows from said first current path through said selected field effect transistors at said timings, said reference signal generator sequentially providing a second current path to the field effect transistors respectively serving as said reference cells at said timings, and sequentially changing said reference selecting lines to said different active levels at said timings so as to sequentially vary the amount of a second current flowing through said second current path to said field effect transistors serving as said reference cells, wherein said data discriminator includes a constant voltage generator generating said different active levels sequentially supplied through said addressing circuit to said at least one of said selecting lines and selectively supplied to said reference selecting lines, said data discriminator further including a comparator comparing the amount of said first electric current with said amount of said second current so as to determine said value of said each piece of data information, wherein said second current path includes a first portion selectively formed in a sub-digit line connected to channels of said field effect transistors serving as said reference cells, a second portion formed in a main digit line, a third portion formed in a first selector connected between said main digit line and said sub-digit line at all times, a fourth portion formed in a reference amplifier serving as a current source of said second electric current and connected to said comparator, and a fifth portion formed in a second selector connected between said reference amplifier and said main digit line at all times, and said reference signal generator further includes a row selector connected between said constant voltage generator and said reference selecting lines respectively connected to gate electrodes of said reference cells and transferring said different active levels to said reference signal lines at said timings, respectively.

13. The semiconductor multivalued memory device as set forth in claim 12, wherein said first current path is approximately equal in resistance to said second current path, and said data discriminator determines said value of said each piece of data information to be equal to the value of one of said pieces of reference data information stored in one of said reference cells when said comparator determines that said amount of said first electric current is equal to said amount of said second electric current flowing through said one of said reference cells.

14. The semiconductor multivalued memory device as set forth in claim 12, wherein said different thresholds are selectively given to said field effect transistors during a fabrication process.

* * * * *